US008405098B2

(12) United States Patent
Matsunami et al.

(10) Patent No.: US 8,405,098 B2
(45) Date of Patent: Mar. 26, 2013

(54) ORGANIC LIGHT EMITTING DEVICE, DISPLAY UNIT INCLUDING THE SAME, AND ILLUMINATING DEVICE INCLUDING THE SAME

(75) Inventors: Shigeyuki Matsunami, Kanagawa (JP); Toshihiro Fukuda, Kanagawa (JP); Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 12/781,089

(22) Filed: May 17, 2010

(65) Prior Publication Data

US 2010/0314636 A1    Dec. 16, 2010

(30) Foreign Application Priority Data

Jun. 12, 2009 (JP) .................................. 2009-141281

(51) Int. Cl.
H01L 29/18 (2006.01)
H01L 33/00 (2010.01)
H01L 29/20 (2006.01)
H01L 21/00 (2006.01)

(52) U.S. Cl. ................. 257/88; 257/89; 438/31; 438/35; 438/28

(58) Field of Classification Search .................... 257/88, 257/89; 438/25, 31
See application file for complete search history.

(56) References Cited

U.S. PATENT DOCUMENTS

| 6,403,983 B1 * | 6/2002 | Mizuno ............................ 257/79 |
| 6,541,130 B2 * | 4/2003 | Fukuda ........................... 428/690 |
| 7,081,871 B2 * | 7/2006 | Kanno et al. ..................... 345/76 |
| 7,247,884 B2 * | 7/2007 | Shibata et al. .................... 257/79 |
| 7,508,127 B2 * | 3/2009 | Miura et al. ..................... 313/506 |
| 7,772,596 B2 * | 8/2010 | Nakamura et al. .............. 257/79 |
| 2006/0163991 A1 * | 7/2006 | Li et al. ........................... 313/113 |
| 2006/0175966 A1 * | 8/2006 | Yamada et al. ............... 313/506 |
| 2006/0267485 A1 * | 11/2006 | Wood et al. .................... 313/504 |
| 2007/0066178 A1 * | 3/2007 | Yamada et al. ................. 445/24 |
| 2007/0102737 A1 * | 5/2007 | Kashiwabara et al. ........ 257/291 |
| 2007/0296334 A1 * | 12/2007 | Matsuda ....................... 313/506 |

FOREIGN PATENT DOCUMENTS

| EP | 2051312 | * 4/2009 |
| JP | 04-328295 | 11/1992 |
| JP | 2001-313180 | 11/2001 |
| JP | 2003-272860 | 9/2003 |
| JP | 2005-100921 | 4/2005 |
| JP | 2006-173550 | 6/2006 |
| JP | 2006-324016 | 11/2006 |
| JP | 2007-012369 | 1/2007 |
| JP | 20007-273231 | 10/2007 |

OTHER PUBLICATIONS

Japanese Office Action issued on Aug. 21, 2012, in connection with counterpart JP Application No. 2009-141281.

* cited by examiner

*Primary Examiner* — Fernando L Toledo
*Assistant Examiner* — Karen Kusumakar
(74) *Attorney, Agent, or Firm* — SNR Denton US LLP

(57) ABSTRACT

An organic light emitting device includes a first electrode and second electrode on a substrate. Light emitting units are positioned between the first and second electrodes. A first light emitting unit includes a first light emitting layer, and a second light emitting unit includes a second light emitting layer. The first electrode reflects light from at least one of the light emitting units to generate an interference pattern with light emitted from the first light emitting layer. The interference pattern has a plurality of interference positions such that a first interference position is located within the first light emitting layer, and a second interference position is located within the second light emitting layer.

20 Claims, 21 Drawing Sheets

ORGANIC LIGHT EMITTING DEVICE, DISPLAY UNIT INCLUDING THE SAME, AND ILLUMINATING DEVICE INCLUDING THE SAME

RELATED APPLICATION DATA

The present application claims priority to and contains subject matter related to that disclosed in Japanese Priority Patent Application JP 2009-141281 filed in the Japanese Patent Office on Jun. 12, 2009, the entire contents of which is hereby incorporated by reference.

BACKGROUND OF THE INVENTION

The present invention relates to an organic light emitting device that emits light by using organic Electro Luminescence (EL) phenomenon, a display unit including an organic light emitting device, and an illuminating device including an organic light emitting device.

Organic light emitting devices (organic EL device, organic electroluminescence device) have attracted attention since each device has a light emitting layer composed of an organic compound between an anode and a cathode and is able to realize a large-area display unit driven with low voltage.

The organic light emitting device structuring the display unit, described above, is provided on a transparent substrate made of, for example, glass or the like. In the organic light emitting device, an anode composed of ITO (Indium Tin Oxide: transparent electrode), an organic layer, and a cathode are layered sequentially from the substrate side. The organic layer has a structure in which an electron hole injection layer, an electron hole transport layer, and an electron transport light emitting layer are sequentially layered from the anode side. In such an organic light emitting device, electron injected from the cathode is recombined with electron hole injected from the anode in the light emitting layer, and light generated in such electron-hole recombination is extracted from the substrate side through the anode.

In general, life of the organic light emitting device is determined by injected electric charge, which is able to be resolved by decreasing the initial luminance in driving. However, decreasing the initial luminance limits practical application, and denies potential possibilities of the organic light emitting device, resulting in inability of realizing a next generation television.

Thus, for the purpose of realizing both high luminance and long life, so-called stack type organic light emitting devices have been proposed. For example, Japanese Unexamined Patent Application Publication No. 2006-173550 discloses a technology in which a plurality of organic layers including a light emitting layer are regarded as one light emitting unit, and two light emitting units are layered to sandwich a connection layer for generating an electric charge between an anode and a cathode.

However, in the case where the respective light emitting units include different color light emitting layers, light emitting characteristics such as color luminance and current efficiency are not sufficient yet for all colors, and there is room for improvement.

SUMMARY

Embodiments of the invention overcome the foregoing deficiencies. Each embodiment is provided with an organic light emitting device in which respective light emitting units include different color light emitting layers that have improved light extraction efficiency for each color.

An embodiment may include a display unit that has the organic light emitting device, thereby achieving improved light extraction efficiency. An embodiment may include an illuminating device that has the organic light emitting device, and thus results in improved light extraction efficiency.

According to an embodiment, an organic light emitting device includes a first electrode and a second electrode on a substrate. The organic light emitting device also includes a first light emitting unit, which includes a first light emitting layer, and a second light emitting unit, which includes a second light emitting layer. The first and second light emitting units are positioned between the first and second electrodes. The first electrode reflects light from at least one of the light emitting units to generate an interference pattern with light emitted from the first light emitting layer. The interference pattern has a plurality of interference positions such that a first interference position is located within the first light emitting layer, and a second interference position is located within the second light emitting layer.

According to an embodiment, an organic light emitting device comprises a stack. The stack includes an anode, a first light emitting layer, a second light emitting layer, and a cathode. The stack is configured to emit white light and generate interference between light emitted from the first light emitting layer and light reflected from the anode. The resulting interference has an interference pattern that includes a first interference position and a second interference position. The second interference position is located within the second light emitting layer. The second light emitting layer may be a red light emitting layer, a green light emitting layer, or a yellow light emitting layer.

According to an embodiment, a method of fabricating an organic light emitting device, which emits white light, includes forming an anode of a laminate structure having a metal film and a transparent film. The method includes forming a plurality of light emitting units on one side of the anode. The plurality of light emitting units include a first light emitting unit having a first light emitting layer and a second light emitting unit having a second light emitting layer. The first light emitting unit and the second light emitting unit are separated by an intervening electric charge layer. The method includes forming a cathode such that the plurality of light emitting units are provided between the anode and the cathode in a stack structure.

According to this method, an interference pattern is generated between light emitted from the first light emitting layer and light reflected from the anode. The interference pattern includes a first interference position and a second interference position. A distance between the anode and the second light emitting layer is formed such that the second interference position of the interference pattern is located within the second light emitting layer.

An organic light emitting device, as disclosed herein, improves the extraction efficiency of light generated in the first color light emitting layer and the light generated in the second color light emitting layer. Therefore, when an electronic apparatus, such as a display unit or an illuminating device, is structured to include an organic light emitting device, then high luminance display or lighting is enabled and achieved by using the organic light emitting device.

Other and further objects, features, and advantages of the invention will appear more fully from the following description.

DETAILED DESCRIPTION OF THE PRESENTLY PREFERRED EMBODIMENTS

Embodiments of the invention will be hereinafter described in detail with reference to the drawings. The description will be given in the following order:

1. First embodiment (example of two stage, three color, and top emission type)
2. First modified example (example of two stage, three color, and bottom emission type)
3. Second modified example (example of two stage, two color, and top emission type)
4. Third modified example (example of two stage, two color, and bottom emission type)
5. Application examples (illuminating device and liquid crystal display unit)
6. Second embodiment (example having color filter: display unit)
7. Application examples (electronic device)
8. Examples

First Embodiment

Figure 1:
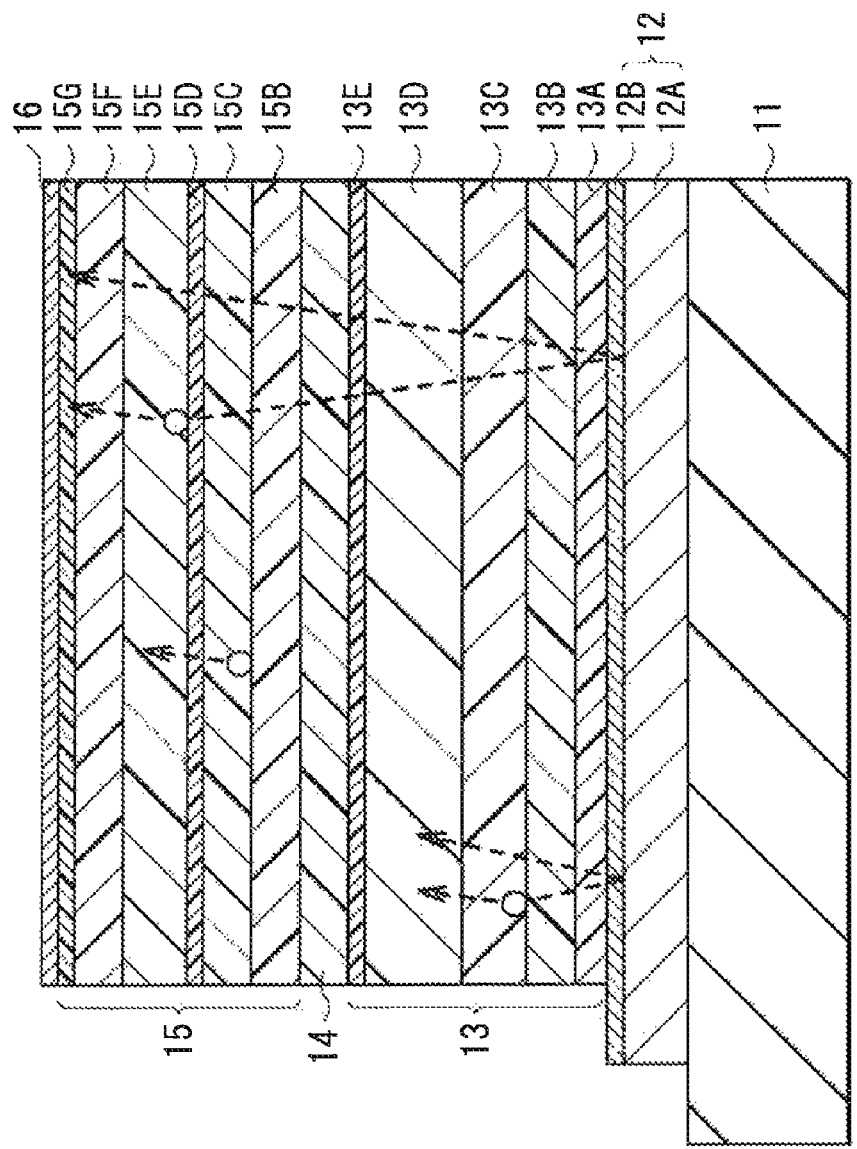
FIG. 1 is a cross sectional view illustrating a structure of an organic light emitting device according to a first embodiment of the invention.

FIG. 1 illustrates a structure of an organic light emitting device according to a first embodiment of the invention. The organic light emitting device may be used for an illuminating device, a liquid crystal use backlight unit or the like. For example, the organic light emitting device has a first electrode 12 as an anode, a first light emitting unit 13, a connection layer 14, a second light emitting unit 15, and a second electrode 16 as a cathode sequentially over a substrate 11.

The substrate 11 is a support medium in which the organic light emitting device is arranged on one main face side thereof, and a suitable substrate may be used as the substrate 11. For example, quartz, glass a metal foil, a resin film, a resin sheet or the like is used. Specially, quartz or glass is preferable. In the case of using the resin, examples of materials include a methacryl resin represented by polymethyl methacrylate (PMMA), polyester such as polyethylene terephthalate (PET), polyethylene naphthalate (PEN), and polybutylene naphthalate (PBN), and a polycarbonate resin. In the case of using the resin, a laminated structure and surface treatment are necessitated in order to inhibit water permeability and gas permeability.

The first electrode 12 has, for example, a lamination direction thickness (hereinafter simply referred to as thickness) from 10 nm to 1000 nm both inclusive. Examples of material of the first electrode 12 include a simple substance or an alloy of metal elements such as chromium (Cr), gold (Au), platinum (Pt), nickel (Ni), copper (Cu), tungsten (W), and silver (Ag). Further, the first electrode 12 may have a laminated structure including a metal film 12A composed of a simple substance or an alloy of the foregoing metal elements and a transparent conductive film 12B composed of an oxide of indium and tin (ITO), InZnO (indium zinc oxide), an alloy of zinc oxide (ZnO) and aluminum (Al) or the like. In the case where the first electrode 12 is used as an anode, the first electrode 12 is desirably made of a material having high electron hole injection characteristics. However, if an appropriate electron hole injection layer is provided, it is able to use a material having a disadvantage of an electron hole injection barrier due to existence of an oxide layer on the surface and a small work function such as an aluminum (Al) alloy as the first electrode 12.

Further, the first electrode 12 also has a function as a reflecting layer. That is, as described later, in the organic light emitting device, light generated, for example, in a blue light emitting layer 13C or the like is reflected by the first electrode 12, and interference is generated between the reflected light and the light generated in the blue light emitting layer 13C or the like.

In the case where the first electrode 12 has the laminated structure composed of the metal film 12A and the transparent conductive film 12B, a reflection face of the light generated in the blue light emitting layer 13C or the like becomes the interface between the metal film 12A and the transparent electrode film 12B.

The first light emitting unit 13 has, for example, a structure in which a first electron hole injection layer 13A, a first electron hole transport layer 13B, the blue light emitting layer 13C, a first electron transport layer 13D, and a first electron injection layer 13E are layered sequentially from the first electrode 12 side. Of the foregoing layers, the layers other than the blue light emitting layer 13C may be provided according to needs.

The first electron hole injection layer 13A is intended to improve the electron hole injection efficiency and is a buffer layer to prevent leakage. The first electron hole injection layer 13A has, for example, a thickness of 10 nm, and is composed of TPTE (N,N-Bis(4-diphenylaminobiphenyl)-N,N-diphenylbenzidine).

The first electron hole transport layer 13B is intended to improve efficiency to transport electron holes into the blue light emitting layer 15C. The first electron hole transport layer 13B has, for example, a thickness of 20 nm, and is composed of a diamine compound shown in Chemical formula 1.

Chemical formula 1

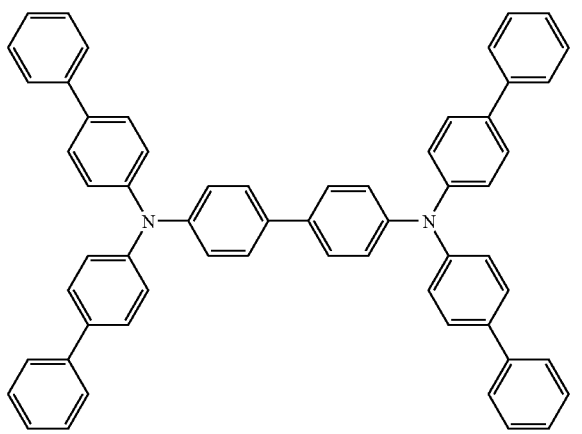

In addition, as a material of the foregoing electron hole injection layer 13A or the foregoing electron hole transport layer 13B, for example, benzine, styryl amine, triphenyl amine, porphyrin, triphyenylene, azatriphyenylene, tetracyanoquinodimethane, triazole, imidazole, oxadiazole, polyarylalkane, phenylenediamine, arylamine, oxazole, anthracene, fluorenone, hydrazone, stilbene, or a derivative thereof is able to be used. In addition, a heterocyclic conjugate system monomer/oligomer/polymer such as a polysilane compound, a vinyl carbazole compound, a thiophene compound, and an aniline compound is able to be used.

Further, more specific examples of material of the foregoing electron hole injection layer 13A or the foregoing electron hole transport layer 13B include α-naphthyl phenyl phenylene diamine, porphyrin, metal tetra phenyl porphyrin, metal naphthalocyanine, hexacyanoazatriphyenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)tripheylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylenevinylene), poly(thiophenevinylene), and poly(2,2'-thienylpyrrole). However, examples thereof are not limited thereto.

The foregoing amine compounds may be used singly, or may be mixed with other electron hole transport material.

In the case where electric field is applied, electron-hole recombination is generated. As a result, the blue light emitting layer 13C generates blue light. The blue light emitting layer 13C has, for example, a thickness of 30 nm, and is composed of a t-butyl ADN shown in Chemical formula 2 as a host material that is doped with a diaminochrysene derivative shown in Chemical formula 3 as a dopant material at a relative film thickness ratio of 5%.

Chemical formula 2

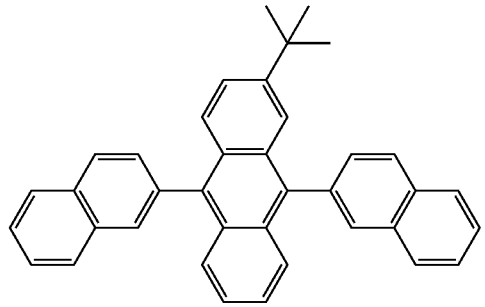

Chemical formula 3

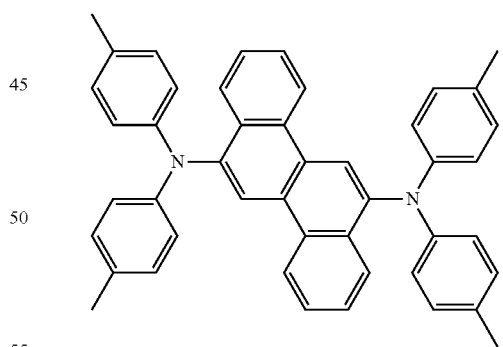

In addition, as a light emitting layer material, an aromatic hydrocarbon compound composed of a phenylene nucleus, a naphthalene nucleus, an anthracene nucleus, a pyrene nucleus, a naphthacene nucleus, a chrysene nucleus, or a perylene nucleus is able to be used. Specifically, 9,10-dipheylanthracene, 9,10-di(1-naphthyl) anthracene, 9,10-di(2-naphthyl)anthracene, 1,6-dipheylpyrene, 1,6-di(1-naphthyl) pyrene, 1,6-di(2-naphthyl), 1,8-dipheylpyrene, 1,8-di(1-naphthyl)pyrene, 1,8-di(2-naphthyl)pyrene, rubrene, 6,12-dipheylchrysene, 6,12-di(1-naphthyl)chrysene, 6,12-di(2-naphthyl)chrysene and the like are able to be suitably used.

Further, the light emitting layer 13C may be added with a small amount of other guest material for the purpose of controlling light emitting spectrum in the light emitting layer 13C. As such other guest material, an organic material such as a naphthalene derivative, an amine compound, a pyrene derivative, a naphthacene derivative, a perylene derivative, a coumarin derivative, and a pyran series dye is used. Specially, an aromatic tertiary amine compound is suitably used.

The first electron transport layer 13D is intended to improve efficiency to transport electrons into the blue light emitting layer 13C. The first electron transport layer 13D has, for example, a thickness of 80 nm, and is composed of BCP (2,9-dimethyl-4,7-diphenyl-1,10-phenanthroline).

Examples of a material of the electron transport layer 13D include quinoline, perylene, bisstyryl, pyrazine, triazole, oxazole, oxadiazole, fluorenone, and a derivative thereof. Specific examples thereof include tris(8-hydroxyquinolinone)aluminum (abbreviated to Alq3), anthracene, naphthalene, phenanthrene, pyrene, anthracene, perylene, butadiene, coumarin, acridine, stilbene, and a derivative thereof.

The first electron injection layer 13E is intended to improve the electron injection efficiency. The first electron injection layer 13E has, for example, a thickness of about 0.5 nm, and is composed of lithium carbonate ($Li_2CO_3$).

Examples of a material composing the electron injection supplementary layer 13E include an oxide, a composite oxide, a halide, or a carbonate of an alkali metal element, a Group 2 element, and a rare earth element.

Of the foregoing, the Group 2 element (Mg, Ca, Sr, and Ba) and the rare earth element (Sc, Y, La, Ce, Pr, Nd, Pm, Sm, Eu, Gd, Tb, Dy, Ho, Er, Tm, Yb, and Lu) may be contained in a state of element.

Examples of the oxide out of the foregoing compounds include an alkali metal oxide such as lithium oxide and sodium oxide, an alkali earth metal oxide such as magnesium oxide and calcium oxide, and a rare earth metal oxide such as scandium oxide and yttrium oxide.

Examples of the composite oxide of each element include lithium molybdate, lithium silicate, cesium molybdate, cesium silicate, calcium molybdate, calcium silicate, magnesium molybdate, and magnesium silicate.

Examples of the halide of each element include a floride, a chloride, a bromide, and an iodide.

Examples of the carbonate of each element include an alkali metal carbonate such as lithium carbonate and sodium carbonate, a carbonate of a Group 2 element such as calcium carbonate, strontium carbonate, and barium carbonate, and a rare earth metal carbonate such as scandium carbonate and yttrium carbonate.

If the foregoing materials are used as a material composing the first electron injection layer 13E, favorable device characteristics are obtained. In view of stability of a bulk state material, film forming stability, cost and the like, as a component material of the first electron injection layer 13E, an alkali metal salt such as lithium fluoride or an alkali metal carbonate such as lithium carbonate is suitable.

At the time of applying a voltage, the connection layer 14 is intended to inject electron holes into the second light emitting unit 15 arranged on the second electrode 16 (cathode) side, and to inject electrons into the first light emitting unit 13 arranged on the first electrode 12 (anode) side. The connection layer 14 is an electric charge layer. The connection layer 14 has, for example, a laminated structure composed of an Alq3 (8-hydroxyquinolinone aluminum) film having a thickness of 5 nm and an HAT (hexaazatriphenylene) film composed of the compound shown in Chemical formula 4 having a thickness of 10 nm. The Alq3 film is doped with, for example, 5% magnesium (Mg) as a metal component.

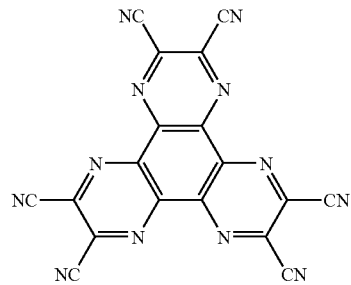

Chemical formula 4

The connection layer 14 may be structured as a single layer composed of a metal oxide such as molybdenum oxide ($MoO_3$), tungsten oxide ($WO_3$), vanadium oxide ($V_2O_5$), and rhenium haptaoxide ($Re_2O_7$), or a charge transfer complex compound such as porphyrin, metal tetraphenyl porphyrin, metal naphthalocyanine, hexacyanoazatriphenylene, 7,7,8,8-tetracyanoquinodimethane (TCNQ), and 7,7,8,8-tetracyano-2,3,5,6-tetrafluoroquinodimethane (F4-TCNQ). In addition, the connection layer 14 may be structured by providing doping for the amine compound as the material exemplified for the foregoing electron hole injection layer 13A or the electron hole transport layer 13B.

The second light emitting unit 15 has, for example, a structure in which a second electron hole transport layer 15B, a red light emitting layer 15C, an intermediate layer 15D, a green light emitting layer 15E, a second electron transport layer 15F, and a second electron injection layer 15G are layered sequentially from the first electrode 12 side. The layers other than the red light emitting layer 15C and the green light emitting layer 15E may be provided according to needs.

The second electron hole transport layer 15B also has a function as an electron hole injection layer. The second electron hole transport layer 15B has, for example, a thickness of 20 nm, and is composed of a diamine compound shown in Chemical formula 1.

For the first electron transport layer 13D and the second electron hole transport layer 15B arranged on both sides of the connection layer 14, the thickness of the first electron transport layer 13D is preferably larger than the thickness of the second electron hole transport layer 15B, since thereby performance is able to be further improved.

The red light emitting layer 15C has, for example, a thickness of 20 nm, and is composed of rubrene as a host material that is doped with a pyrromethene boron complex shown in Chemical formula 5 as a dopant material at a relative film thickness ratio of 1%.

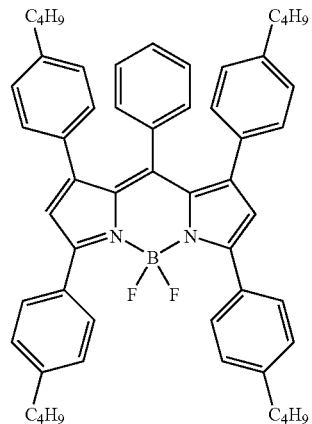

Chemical formula 5

The intermediate layer 15D has, for example, a thickness of 5 nm, and is composed of an electron hole transport material. The intermediate layer 15D is preferably made of an amine material. Specific examples thereof include the amine compound shown in Chemical formula 1.

The green light emitting layer 15E has, for example, a thickness of 40 nm, and is composed of 9,10-di(2-naphtyl) anthracene (ADN) as a host material that is doped with a diaminoanthracene derivative shown in Chemical formula 6 as a dopant material at a relative film thickness ratio of 10%.

Chemical formula 6

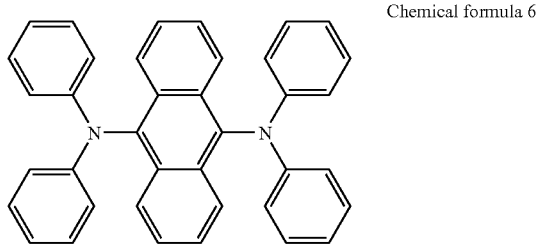

The intermediate layer 15D may be made of the same material as that of the host material of the green light emitting layer 15E, that is, ADN. Thereby, in a manufacturing step, the green light emitting layer 15E and the intermediate layer 15D are able to be continuously formed by blocking only vaporization of the dopant material.

The second electron transport layer 15F has, for example, a thickness of 20 nm, and is composed of BCP.

The second electron injection layer 15G has, for example, a thickness of 0.3 nm, and is composed of $Li_2O$.

Optical transparency of the second electrode 16 is preferably high as much as possible to improve extraction efficiency of light generated in the blue light emitting layer 13C or the like. Thus, it is preferable that the second electrode 16 has, for example, a thickness of about 3 nm, and is made of a metal foil film composed of a simple substance or an alloy of a metal element such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. Further, the second electrode 16 may be made of a transparent conductive film such as ITO (indium tin composite oxide) and IZO (indium zinc composite oxide).

Figure 2:
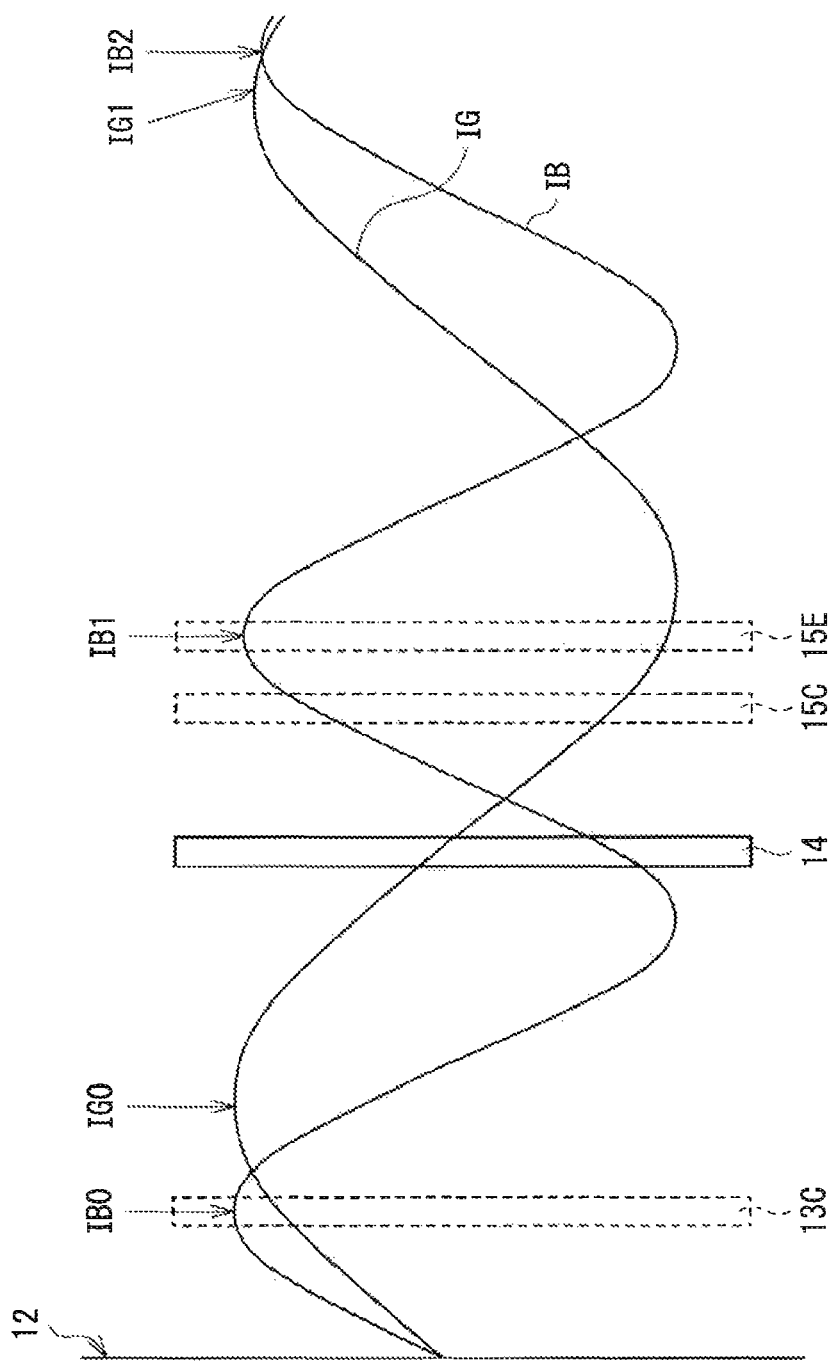
FIG. 2 is a diagram for explaining an arrangement of the light emitting layers of the organic light emitting device illustrated in FIG. 1.

FIG. 2 illustrates arrangement relation among the first electrode 12, the blue light emitting layer 13C, the connection layer 14, the red light emitting layer 15C, and the green light emitting layer 15E. Light generated in the blue light emitting layer 13C has blue interference pattern IB including a plurality of blue interference positions IB0, IB1, IB2 and the like where the light generated in the blue light emitting layer 13C and light reflected from the first electrode 12 are mutually intensified by interference. The green light emitting layer 15E has green interference pattern IG including a plurality of green interference positions IG0, IG1 and the like where light generated in the green light emitting layer 15E and reflected light in the first electrode 12 are mutually intensified by interference. The blue light emitting layer 13C includes one of the plurality of blue interference positions IB0, IB1, IB2 and the like. Meanwhile, the green light emitting layer 15E includes another of the plurality of blue interference positions IB0, IB1, IB2, and the like. Thereby, in the organic light emitting device, blue and green light extraction efficiency is able to be improved.

As illustrated in FIG. 2, each of the interference positions corresponds to a respective crest (i.e., peak) of the resulting interference pattern. As is known, an interference pattern is the waveform resulting from the interference of two or more other waveforms. Each of the interference positions of an interference pattern is enumerated from the point of reflection, such as anode 12. For example, the first interference position (e.g., IB0, IG0, and etc) corresponds to the first peak from the anode. The second interference position (e.g., IB1, IG1, and etc.) corresponds to the second peak from the anode. Each subsequent interference position may be referenced in a similar manner.

An optical distance L1 between the blue interference position included in the blue light emitting layer 13C and the first electrode 12 satisfies Mathematical formula 1. An optical distance Ln between the blue interference position included in the green light emitting layer 15E and the first electrode 12 satisfies Mathematical formula 2. For $L_1$, $L_n$ and $\lambda_1$, $\lambda_n$ in the formulas, the unit should be unified, and for example, (nm) is used as the unit.

$$L_1 = (m_1 - \Phi/2\pi)\lambda_1/2 \quad \text{Mathematical formula 1}$$

In the formula, "$L_1$" represents the optical distance between the blue interference position included in the blue light emitting layer 13C and the first electrode 12. "$m_1$" represents an order (0 or an integer number). "$\Phi$" represents phase shift generated when the light generated in the blue light emitting layer 13C is reflected by the first electrode 12. "$\lambda_1$" represents peak wavelength of spectrum when the light generated in the blue light emitting layer 13C is irradiated from the second electrode 16 side.

$$L_n = (m_n - \Phi/2\pi)\lambda_n/2 \quad \text{Mathematical formula 2}$$

$m_n > m_1$
$\lambda_n = \lambda_1$

In the formula, "$L_n$" represents the optical distance between the blue interference position included in the green light emitting layer 15E and the first electrode 12. "$m_n$" represents an order (natural number). "$\Phi$" represents phase shift generated when the light generated in the blue light emitting layer 13C is reflected by the first electrode 12.

Specifically, the blue light emitting layer 13C is preferably arranged to include the most proximal interference position IB0 (in the case where the order m1 in Mathematical formula 1 is 0: zero order interference position) that is closest to the first electrode 12 out of the blue interference positions IB0, IB1, IB2 and the like. The green light emitting layer 15E is preferably arranged to include the position IB1 (in the case where the order mn in Mathematical formula 2 is 1: first order interference position) that is secondly closest to the first electrode 12 after the most proximal interference position IB0 out of the blue interference positions IB0, IB1 and the like. Thereby, the thickness of the first light emitting unit 13 and the thickness of the second light emitting unit 15 are decreased, and accordingly a voltage necessary for light emission is able to be decreased.

The blue interference positions IB0, IB1, IB2 and the like represent a point determined by Mathematical formula 1 or Mathematical formula 2. In practice, the blue light emitting layer 13C and the green light emitting layer 15E have a certain degree of thickness. If the blue interference positions IB0, IB1, and IB2 are included in a given location in the thickness direction of the blue light emitting layer 13C or the green light emitting layer 15E, the foregoing effect is able to be obtained.

Figure 3:
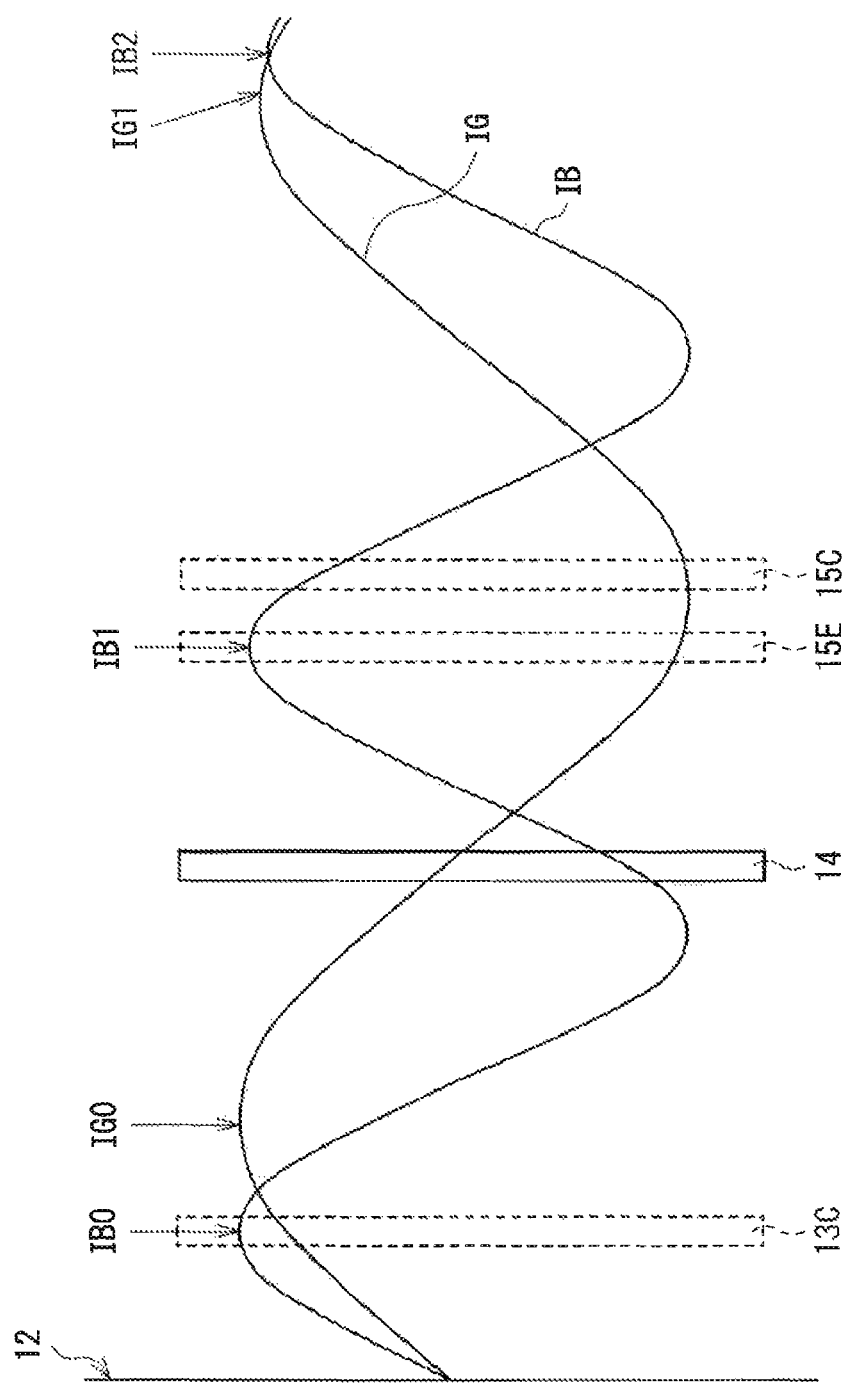
FIG. 3 is a diagram for explaining another arrangement of the light emitting layers illustrated in FIG. 2.

It is enough that the red light emitting layer 15C is arranged in the vicinity of the green light emitting layer 15E. The red light emitting layer 15C is not necessarily arranged to include the blue interference positions IB0, IB1, IB2 and the like. The red light emitting layer 15C may be arrange on the first electrode 12 side of the green light emitting layer 15E as illustrated in FIG. 2. Otherwise, the red light emitting layer 15C may be arranged on the second electrode 16 side of the green light emitting layer 15E as illustrated in FIG. 3.

Figure 4:
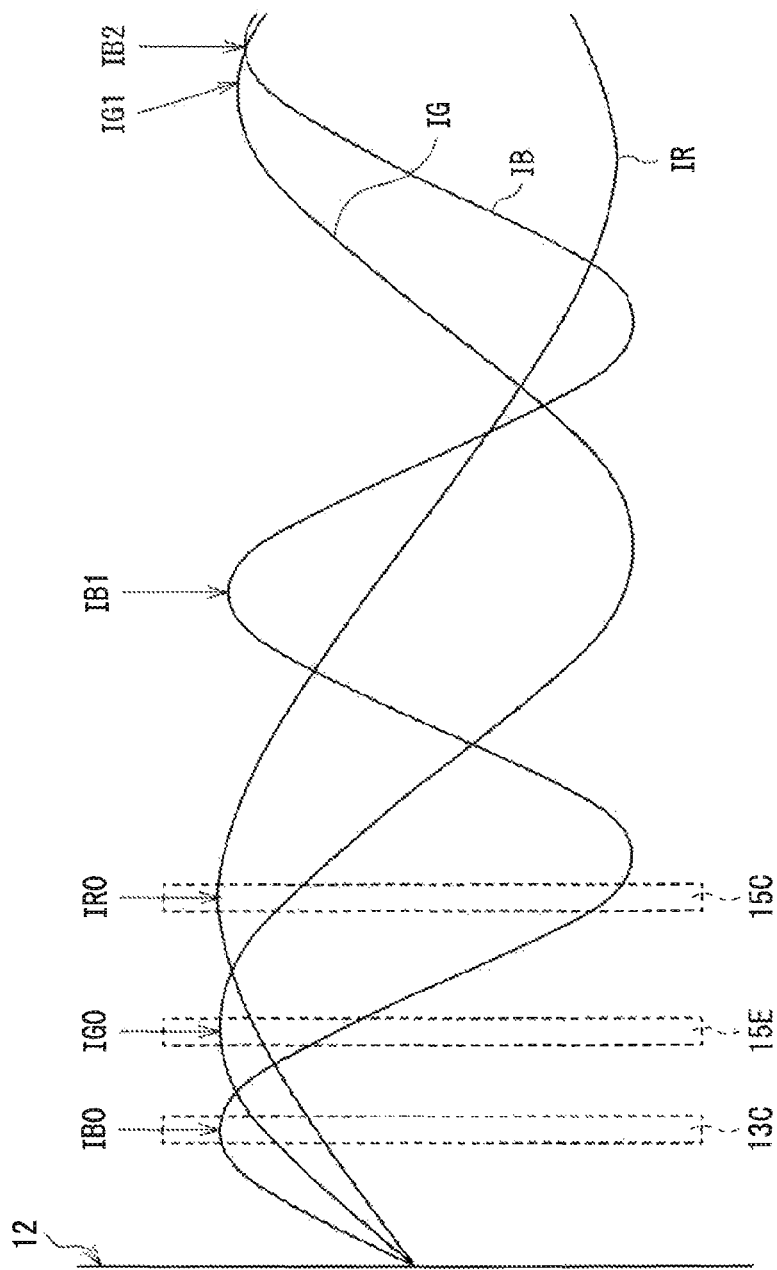
FIG. 4 is a diagram for explaining an arrangement of light emitting layers of a related organic light emitting device.

FIG. 4 illustrates arrangement of each color light emitting layer in an existing lamination type organic light emitting device described, for example, in Japanese Unexamined Patent Application Publication No. 2007-12369. The existing organic light emitting device uses interference by reflection in the first electrode 12 as this embodiment does. However, the existing organic light emitting device has a totally different structure from the structure of this embodiment in the following point. That is, the blue light emitting layer 13C is arranged to include the most proximal interference position IB0 out of the plurality of blue interference positions IB0, IB1, IB2 and the like. The green light emitting layer 15E is arranged to include the most proximal interference position IG0 out of the plurality of green interference positions IG0, IG1 and the like. Light generated in the red light emitting layer 15C has red interference pattern IR including a plurality of red interference positions IR0, IR1 and the like where light generated in the red light emitting layer 15C and reflected light in the first electrode 12 are mutually intensified by interference. The red light emitting layer 15C is arranged to include the most proximal interference position IR0 out of the plurality of red interference positions IR0, IR1 and the like.

A manufacturing method, according to an embodiment of the invention, will now be described. The organic light emitting device is able to be manufactured, for example, as follows.

First, the substrate 11 made of the foregoing material is prepared. The first electrode 12 made of the foregoing material is formed on the substrate 11 by, for example, sputtering method or evaporation method.

Next, the first electron hole injection layer 13A, the first electron hole transport layer 13B, the blue light emitting layer 13C, the first electron transport layer 13D, and the first electron injection layer 13E that have the foregoing thickness and are made of the foregoing material are sequentially layered over the first electrode 12 by, for example, evaporation method to form the first light emitting unit 13. At this time, for example, the evaporation rate of the first electron hole injection layer 13A is from 0.2 nm/sec to 0.4 nm/sec both inclusive, the evaporation rate of the first electron hole transport layer 13B is from 0.5 nm/sec to 0.7 nm/sec both inclusive, and the evaporation rate of the first electron injection layer 13E is 0.01 nm/sec.

Subsequently, the connection layer 14 that has the foregoing thickness and is made of the foregoing material is formed on the first light emitting unit 13 by, for example, evaporation method.

After that, the second electron hole transport layer 15B, the red light emitting layer 15C, the intermediate layer 15D, the green light emitting layer 15E, the second electron transport layer 15F, and the second electron injection layer 15G that have the foregoing thickness and are made of the foregoing material are sequentially layered over the connection layer 14 by, for example, evaporation method to form the second light emitting unit 15. At this time, for example, the evaporation rate of the second electron hole transport layer 15F is from 0.2 nm/sec to 0.4 nm/sec both inclusive, the evaporation rate of the intermediate layer 15D is from 0.2 nm/sec to 0.4 nm/sec both inclusive, and the evaporation rate of the second electron injection layer 15G is 0.01 nm/sec.

After the second light emitting unit is formed, the second electrode 16 that has the foregoing thickness and is made of the foregoing material is formed on the second light emitting unit 15 by, for example, evaporation method. According to needs, it is possible that a protective layer composed of silicon nitride or the like (not illustrated, and refer to FIG. 19) is formed for sealing by, for example, CVD method (chemical vapor-phase deposition method).

In the organic light emitting device, in the case where a given voltage is applied between the first electrode 12 and the second electrode 16, a current is injected into the blue light emitting layer 13C, the red light emitting layer 15C, and the green light emitting layer 15E, and electron-hole recombination is generated. Thereby, blue, red, and green light emission is generated. In result, color mixture thereof initiates white light emission.

In this embodiment, the blue light emitting layer 13C is arranged to include the most proximal interference position IB0 out of the plurality of blue interference positions IB0, IB1, IB2 and the like. Thus, if light generated in the light emitting layer 13C is reflected by the first electrode 12 and is returned to the light emitting position, the returned light phase becomes the same as the phase at the time of light emission. Thus, the generated light and the reflected light are mutually intensified, and the light generated in the blue light emitting layer 13C is effectively extracted. Further, the green light emitting layer 15E is arranged to include the position IB1 that is secondly closest to the first electrode 12 after the most proximal interference position IB0 out of the plurality of blue interference positions IB0, IB1 and the like. Thus, the light generated in the green light emitting layer 15E is effectively extracted.

As described above, in this embodiment, the blue light emitting layer 13C is arranged to include one of the plurality of blue interference positions IB0, IB1, IB2 and the like, while the green light emitting layer 15E is arranged to include another of the plurality of blue interference positions IB0, IB1, IB2 and the like. Thereby, light extraction efficiency of the light generated in the blue light emitting layer 13C and the light generated in the green light emitting layer 15E is able to be improved. Accordingly, electric power consumption is able to be decreased.

First Modified Example

Figure 5:
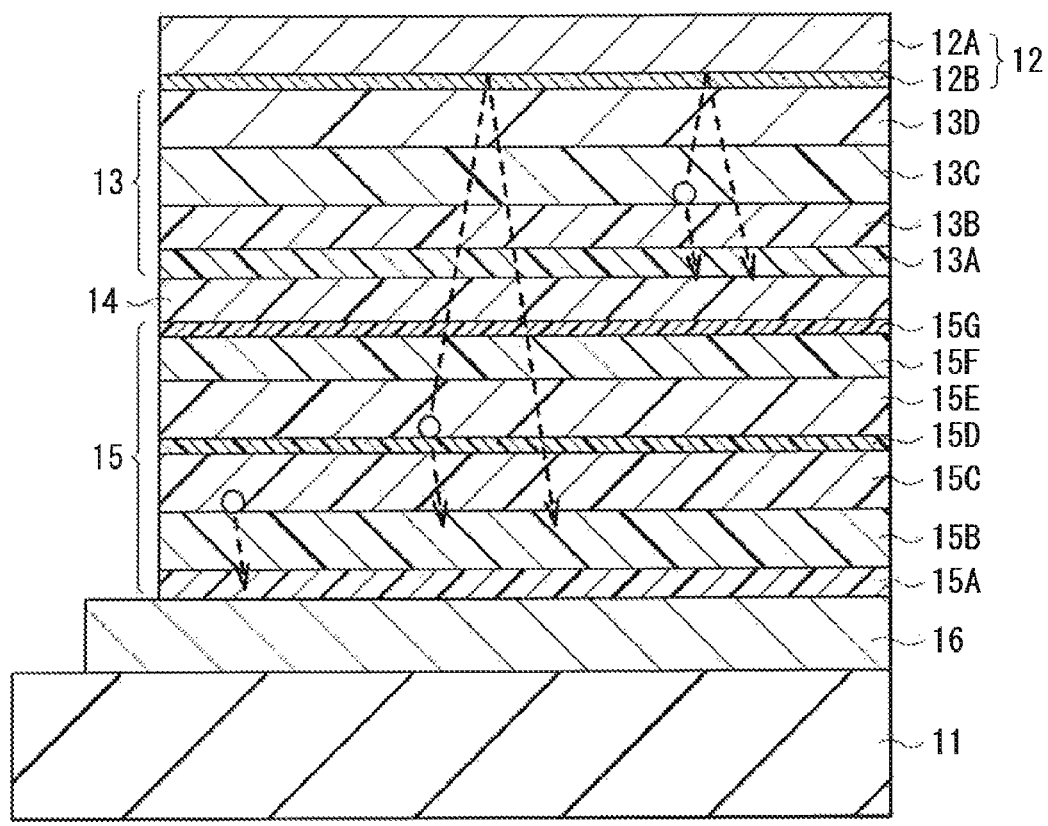
FIG. 5 is a cross sectional view illustrating a structure of an organic light emitting device according to a first modified example.

FIG. 5 illustrates a cross sectional structure of an organic light emitting device according to a first modified example. The organic light emitting device has a structure similar to that of the first embodiment except that the organic light emitting device is a bottom emission type device in which light generated in the blue light emitting layer 13C and the like is extracted from the substrate 11 side, and action and effect thereof are similar to those of the first embodiment. Thus, a description will be given by affixing the same referential symbols for the corresponding elements.

The organic light emitting device has the second electrode 16 as an anode, the second light emitting unit 15, the connection layer 14, the first light emitting unit 13, and the first electrode 12 as a cathode sequentially over the substrate 11.

The first electrode 12 has a structure in which an LiF film 12B having a thickness of about 0.3 nm and an aluminum film 12A having a thickness of 100 nm are sequentially layered from the substrate 11 side. The first electrode 12 also has a function as a reflecting layer as in the first embodiment.

The first light emitting unit 13 has, for example, a structure in which the first electron transport layer 13D, the blue light emitting layer 13C, the first electron hole transport layer 13B, and the first electron hole injection layer 13A are layered sequentially from the first electrode 12 side. Of the foregoing layers, the layers other than the blue light emitting layer 13C may be provided according to needs.

The first electron hole injection layer 13A has, for example, a thickness of 10 nm, and is composed of TPTE.

The first electron hole transport layer 13B has, for example, a thickness of nm, and is composed of α-NPD(N,N'-bis(1-naphthyl)-N,N'-diphenyl[1,1'-biphenyl]-4,4'-diamine).

The blue light emitting layer 13C has, for example, a thickness of 30 nm, and is composed of t-butyl ADN shown in Chemical formula 2 as a host material that is doped with a diaminochrysene derivative shown in Chemical formula 7 as a dopant material at a relative film thickness ratio of 5%.

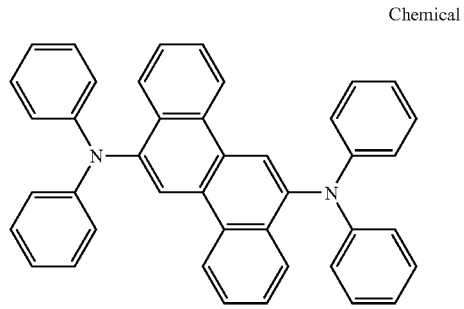

Chemical formula 7

The first electron transport layer 13D has, for example, a thickness of 30 nm, and is composed of BCP.

The connection layer 14 has, for example, a laminated structure composed of an Alq3 film having a thickness of 10 nm and an HAT film composed of the compound shown in Chemical formula 4 having a thickness of 10 nm. The Alq3 film is doped with, for example, 5% magnesium (Mg) as a metal component.

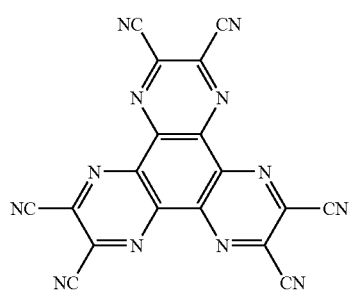

Chemical formula 4

The second light emitting unit 15 has, for example, a structure in which the second electron injection layer 15G, the second electron transport layer 15F, the green light emitting layer 15E, the intermediate layer 15D, the red light emitting layer 15C, the second electron hole transport layer 15B, and the second electron hole injection layer 15A are layered sequentially from the first electrode 12 side. The layers other than the red light emitting layer 15C and the green light emitting layer 15E may be provided according to needs.

The second electron hole injection layer 15A has, for example, a thickness of 10 nm, and is composed of TPTE.

The second electron hole transport layer 15B has, for example, a thickness of 30 nm, and is composed of α-NPD.

The red light emitting layer 15C has, for example, a thickness of 20 nm, and is composed of rubrene as a host material that is doped with a pyrromethene boron complex shown in Chemical formula 5 as a dopant material at a relative film thickness ratio of 1%.

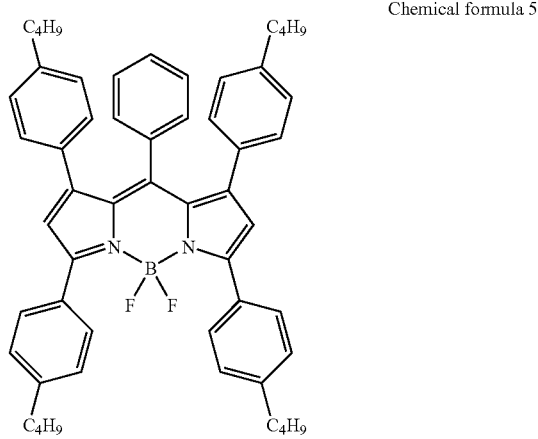

Chemical formula 5

The intermediate layer 15D has, for example, a thickness of 5 nm, and is composed of α-NPD.

The green light emitting layer 15E has, for example, a thickness of 40 nm, and is composed of ADN as a host material that is doped with a diaminoanthracene derivative shown in Chemical formula 6 as a dopant material at a relative film thickness ratio of 5%.

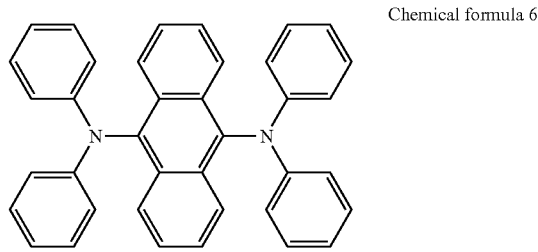 [SMILES: c1ccc(N(c2ccccc2)c2c3ccccc3c(N(c3ccccc3)c3ccccc3)c3ccccc23)cc1]

Chemical formula 6

The second electron transport layer 15F has, for example, a thickness of 70 nm, and is composed of BCP.

The second electron injection layer 15G has, for example, a thickness of 0.3 nm, and is composed of LiF.

The second electrode 16 has, for example, a thickness of 200 nm, and is composed of ITO.

Figure 6:
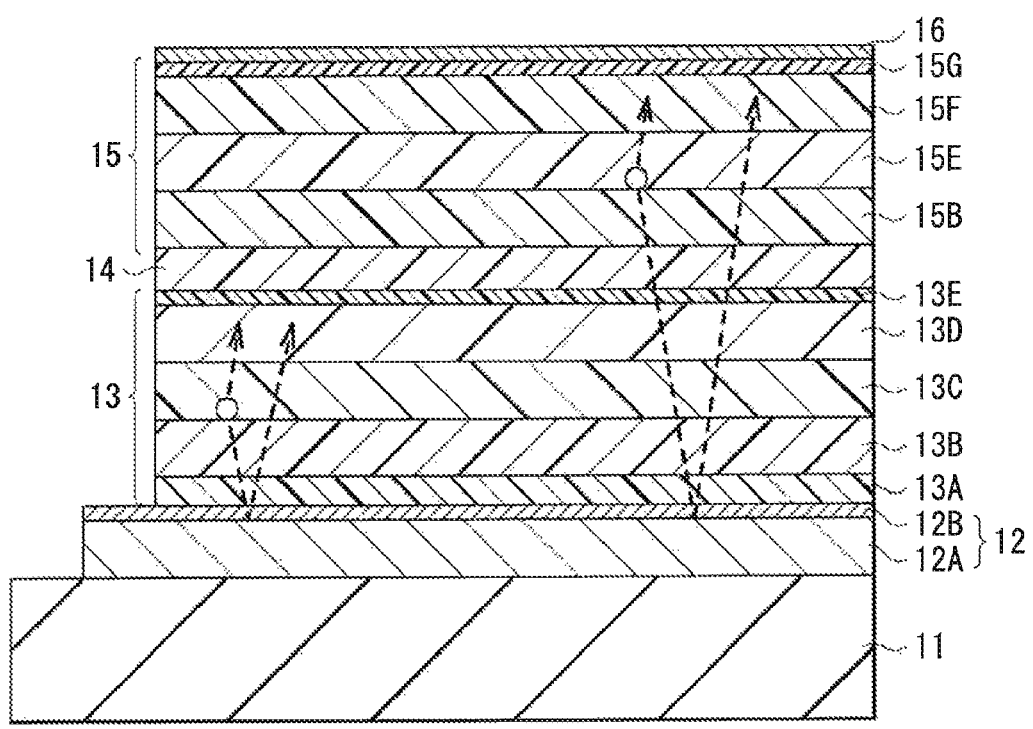
FIG. 6 is a cross sectional view illustrating a structure of an organic light emitting device according to a second modified example.
Figure 7:
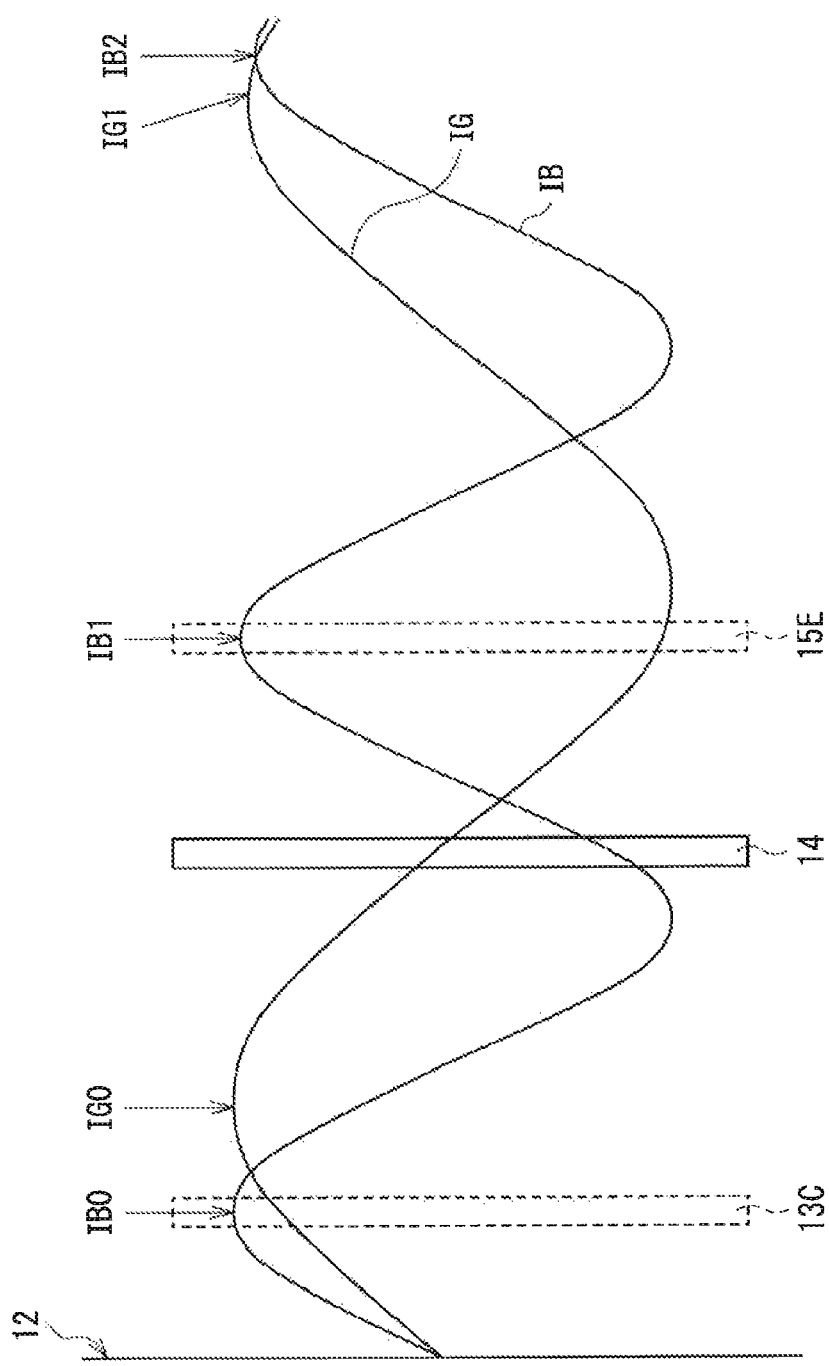
FIG. 7 is a diagram for explaining an arrangement of the light emitting layers of the organic light emitting device illustrated in FIG. 6.

The organic light emitting device is able to be manufactured in the same manner as that of the first embodiment. At this time, for example, the evaporation rate of the second electron hole injection layer 15A is from 0.2 nm/sec to 0.4 nm/sec both inclusive, the evaporation rate of the second electron hole transport layer 15B is from 0.2 nm/sec to 0.4 nm/sec both inclusive, the evaporation rate of the intermediate layer 15D is from 0.2 nm/sec to 0.4 nm/sec both inclusive, and the evaporation rate of the second electron injection layer 15G is 0.01 nm/sec. Further, the evaporation rate of the first electron hole transport layer 13B is from 0.2 nm/sec to 0.4 nm/sec both inclusive Second Modified Example FIGS. 6 and 7 illustrate a cross sectional structure of an organic light emitting device according to a second modified example. The organic light emitting device has a structure similar to that of the foregoing first embodiment, except that the organic light emitting device is a two stage and two color top emission type device having only the blue light emitting layer 13C and the green light emitting layer 15E, and is able to be manufactured in the same manner as that of the foregoing first embodiment. Action and effect thereof are similar to those of the foregoing first embodiment.

Third Modified Example

Figure 8:
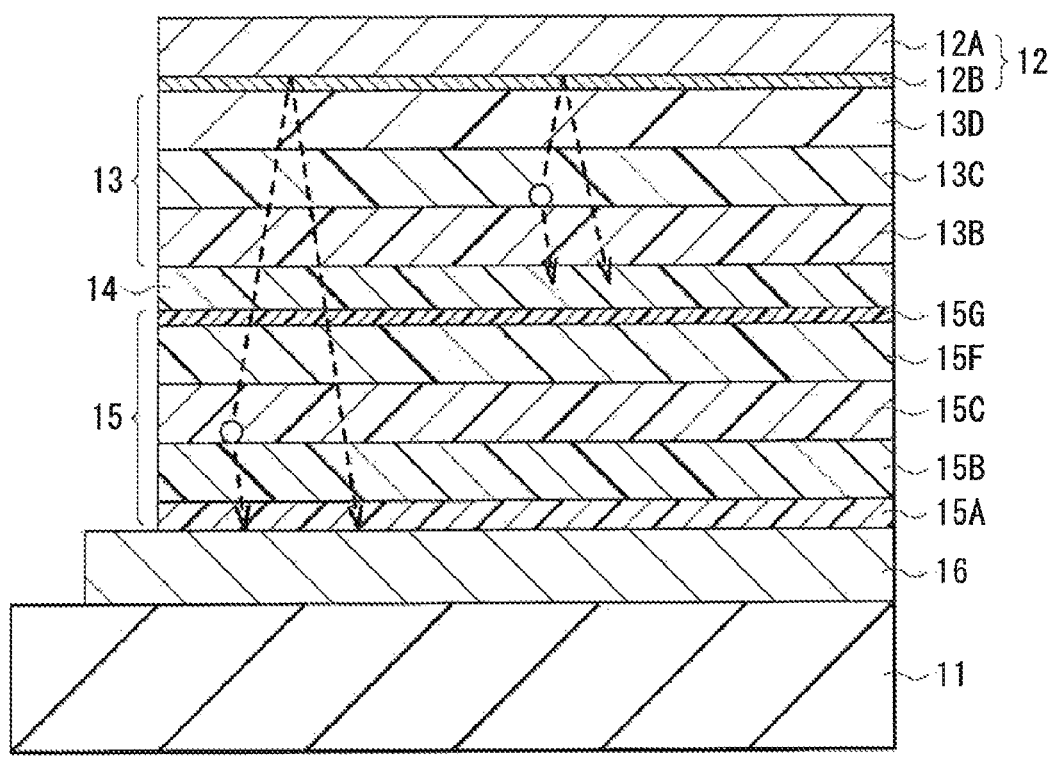
FIG. 8 is a cross sectional view illustrating a structure of an organic light emitting device according to a third modified example.

FIG. 8 illustrates a cross sectional structure of an organic light emitting device according to a third modified example. The organic light emitting device has a structure similar to that of the first modified example, except that the organic light emitting device is a two stage and two color bottom emission type device having only the blue light emitting layer 13C and the red light emitting layer 15C, and is able to be manufactured in the same manner as that of the foregoing first modified example. Action and effect thereof are similar to those of the foregoing first modified example.

The first light emitting unit 13 has, for example, a structure in which the first electron transport layer 13D, the blue light emitting layer 13C, and the first electron hole transport layer 13B are layered sequentially from the first electrode 12 side. Of the foregoing layers, the layers other than the blue light emitting layer 13C may be provided according to needs.

The first electron hole transport layer 13B has, for example, a thickness of 20 nm, and is composed of α-NPD.

The blue light emitting layer 13C has, for example, a thickness of 30 nm, and is composed of ADN as a host material that is doped with a diaminochrysene derivative shown in Chemical formula 7 as a dopant material at a relative film thickness ratio of 5%.

Chemical formula 7

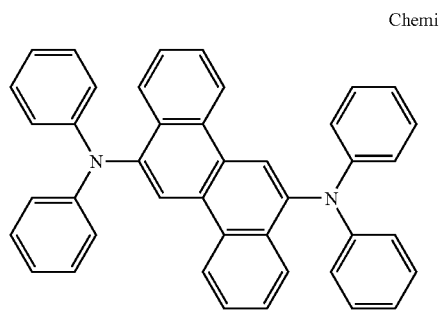

The first electron transport layer 13D has, for example, a thickness of 30 nm, and is composed of BCP.

The connection layer 14 has, for example, a laminated structure composed of an Alq3 film having a thickness of 10 nm and an HAT film composed of the compound shown in Chemical formula 4 having a thickness of 10 nm. The Alq3 film is doped with, for example, 5% magnesium (Mg) as a metal component.

Chemical formula 4

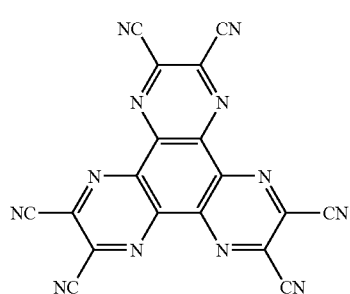

The second light emitting unit 15 has, for example, a structure in which the second electron injection layer 15G, the second electron transport layer 15F, the red light emitting layer 15C, the second electron hole transport layer 15B, and the second electron hole injection layer 15A are layered sequentially from the first electrode 12 side. The layers other than the red light emitting layer 15C may be provided according to needs.

The second electron hole injection layer 15A has, for example, a thickness of 10 nm, and is composed of TPTE.

The second electron hole transport layer 15B has, for example, a thickness of 25 nm, and is composed of α-NPD.

The red light emitting layer 15C has, for example, a thickness of 45 nm, and is composed of rubrene as a host material that is doped with a pyrromethene boron complex shown in Chemical formula 5 as a dopant material at a relative film thickness ratio of 1%.

Chemical formula 5

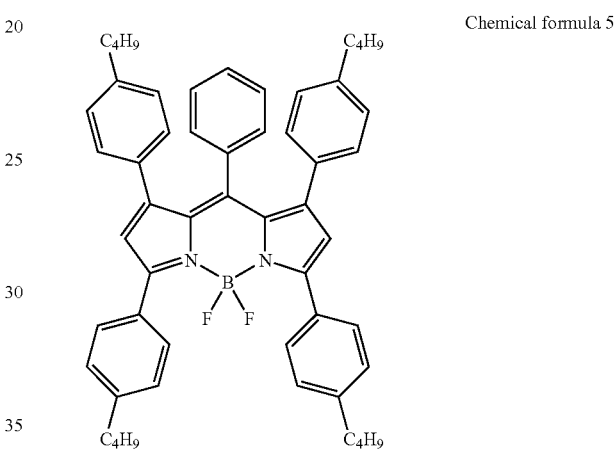

The second electron transport layer 15F has, for example, a thickness of 65 nm, and is composed of BCP.

The second electron injection layer 15G has, for example, a thickness of 0.3 nm, and is composed of LiF.

The second electrode 16 has, for example, a thickness of 200 nm, and is composed of ITO.

The organic light emitting device is able to be manufactured in the same manner as that of the first modified example. At this time, for example, the evaporation rate of the second electron hole injection layer 15A is from 0.2 nm/sec to 0.4 nm/sec both inclusive, the evaporation rate of the second electron hole transport layer 15B is from 0.2 nm/sec to 0.4 nm/sec both inclusive, and the evaporation rate of the second electron injection layer 15G is 0.01 nm/sec. Further, the evaporation rate of the first electron hole transport layer 13B is from 0.2 nm/sec to 0.4 nm/sec both inclusive.

Further, in the second modified example and the third modified example, the green light emitting layer 15E or the red light emitting layer 15C is provided as a yellow light emitting layer 15E (or 15C), and white light emission is able to be obtained by color mixture of light from the blue light emitting layer 15C and the yellow light emitting layer 15E (or 15C).

Illuminating Device

Figure 9:
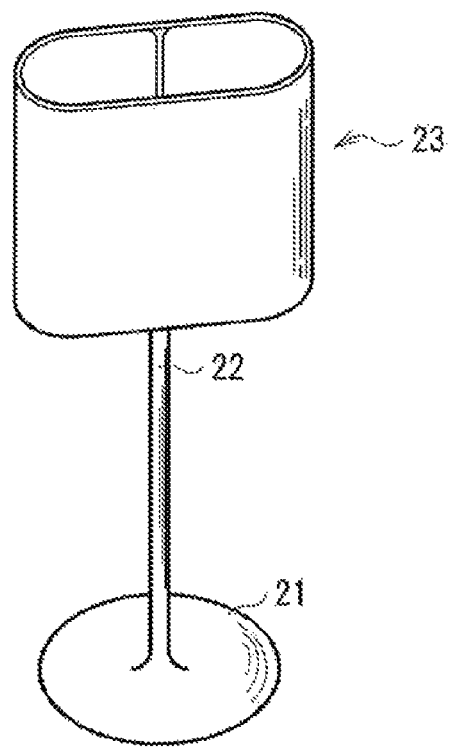
FIG. 9 is a perspective view illustrating an appearance of an example of an illuminating device including the organic light emitting device illustrated in FIG. 1.
Figure 10:
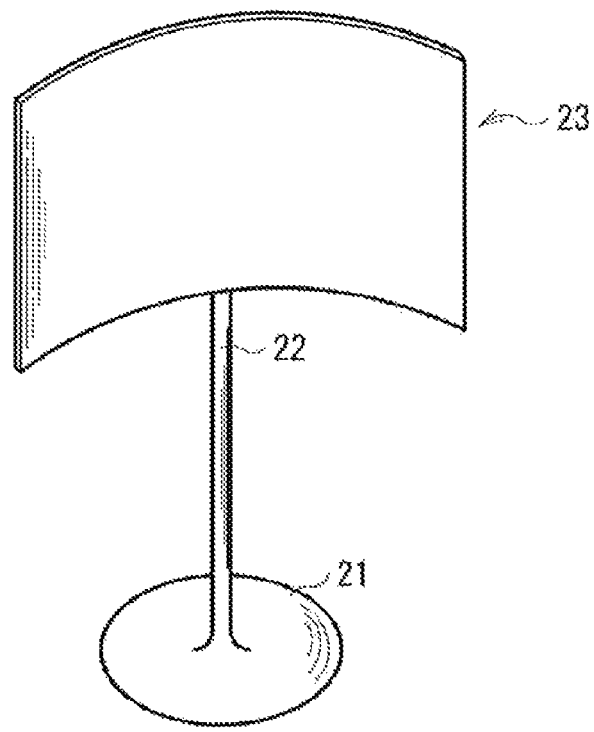
FIG. 10 is a perspective view illustrating an appearance of another example of an illuminating device.

FIG. 9 and FIG. 10 illustrate an appearance of a tabletop illuminating device to which the organic light emitting device of the first embodiment or the modified examples 1 to 3 is applied. In the illuminating device, a lighting section 23 is attached to a column 22 provided on a base 21. The lighting section 23 is composed of the white light emission type organic light emitting device according to the foregoing first embodiment or the foregoing modified examples 1 to 3. If a flexible member such as a resin substrate is used as the substrate 11, the lighting section 23 may be formed in a given shape such as the cylindrical shape illustrated in FIG. 9 and the curved shape illustrated in FIG. 10.

Figure 11:
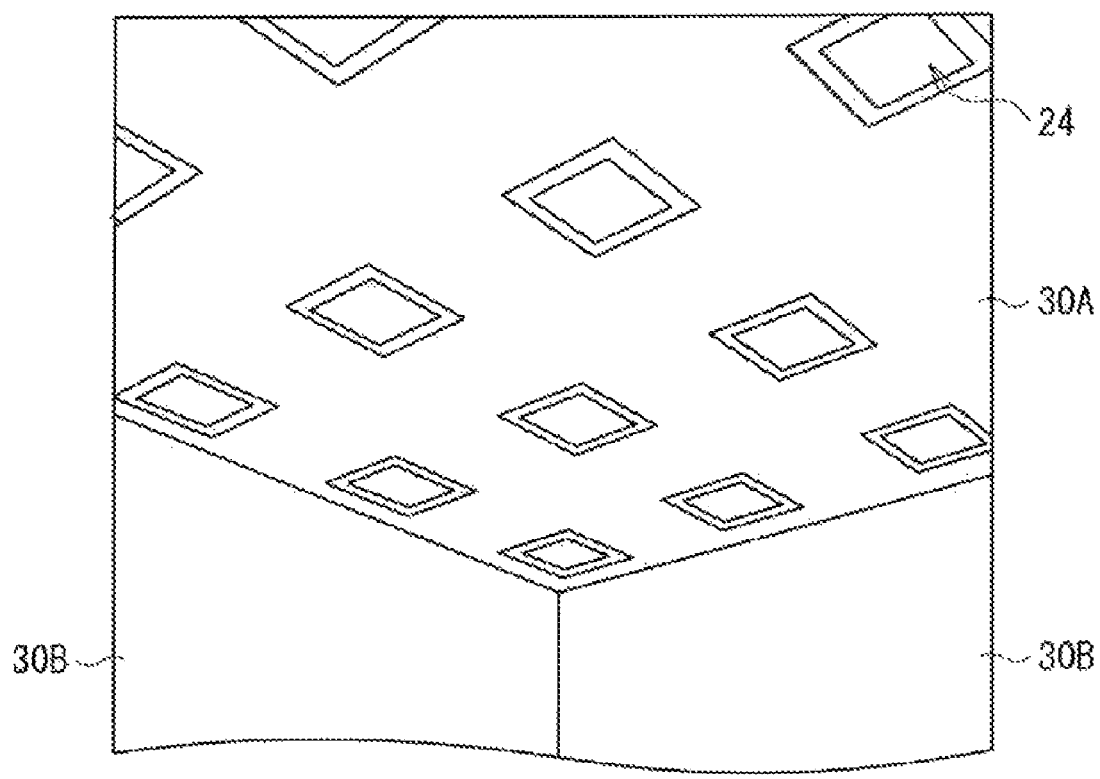
FIG. 11 is a perspective view illustrating an appearance of still another example of an illuminating device.

FIG. 11 illustrates an appearance of a room illuminating device to which the organic light emitting device of the first embodiment or the modified examples 1 to 3 is applied. The illuminating device has, for example, a lighting section 24 composed of the white light emission type organic light emitting device according to the foregoing first embodiment or the foregoing modified examples 1 to 3. The appropriate number of the lighting sections 24 are arranged at certain intervals on a ceiling 30A of a building. The arrangement place of the lighting section 24 is not limited to the ceiling 30A, but is able to be arranged in a given place such as a wall 30B and a floor (not illustrated) according to the purpose.

Liquid Crystal Display Unit

Figure 12:
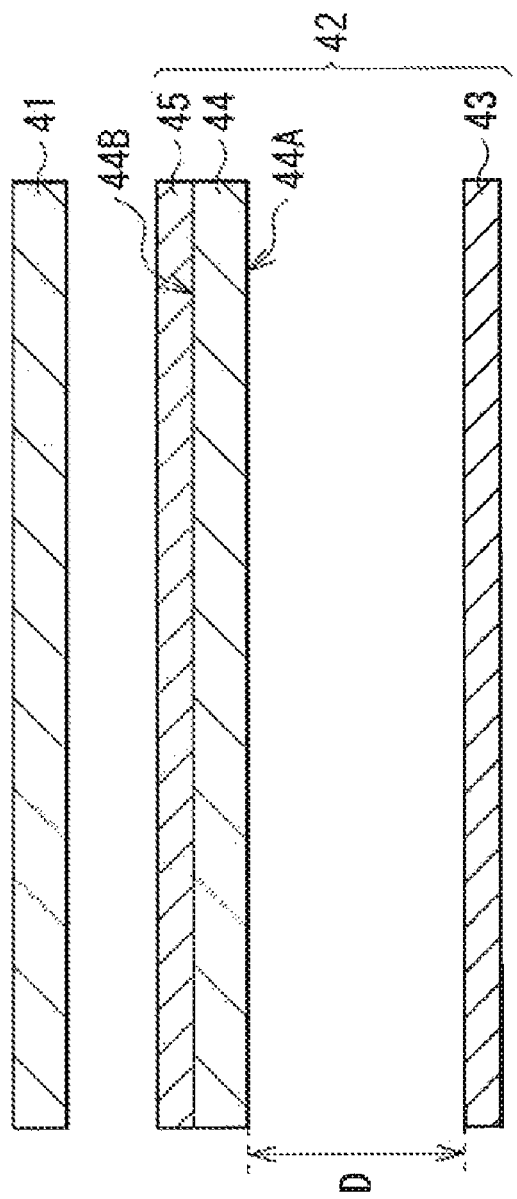
FIG. 12 is a cross sectional view illustrating a schematic structure of a liquid crystal display unit including the organic light emitting device illustrated in FIG. 1.

FIG. 12 illustrates a schematic structure of a liquid crystal display unit to which the organic light emitting device of the first embodiment or the modified examples 1 to 3 is applied. The liquid crystal display unit is used as a liquid crystal television unit or the like, and is a transmissive color liquid crystal display unit having a liquid crystal panel 41 and a backlight unit (surface light source unit) 42.

The liquid crystal panel 41 is a transmissive liquid crystal panel in which a liquid crystal layer is sandwiched between a pair of transparent substrates. On the inner face side of the transparent substrate, a transparent electrode film, an oriented film, a color filter and the like are provided. On outer face sides of the transparent substrate, a deflecting plate is respectively provided. According to needs, an optical compensating sheet such as a wave plate may be arranged between the transparent substrate and the deflecting plate.

The backlight unit 42 has a light source 43 and a diffusion plate 44. The light source 43 is composed of the white light emission type organic light emitting device according to the foregoing first embodiment or the foregoing modified examples 1 to 3. The diffusion plate 44 is combined with an optical function sheet 45 as appropriate to structure a screen. Light from the optical source 43 is irradiated to a first face 44A, and the light is irradiated again from a second face 44B on the opposite side of the first face 44A. The diffusion plate 44 is placed distance D apart from the light source 43. The light irradiated from the light source 43 is mixed in a space between the screen composed of the diffusion plate 44 and the optical function sheet 45 and the light source 43. Thereby, light entering the diffusion plate 44 is uniformized.

Second Embodiment

Figure 13:
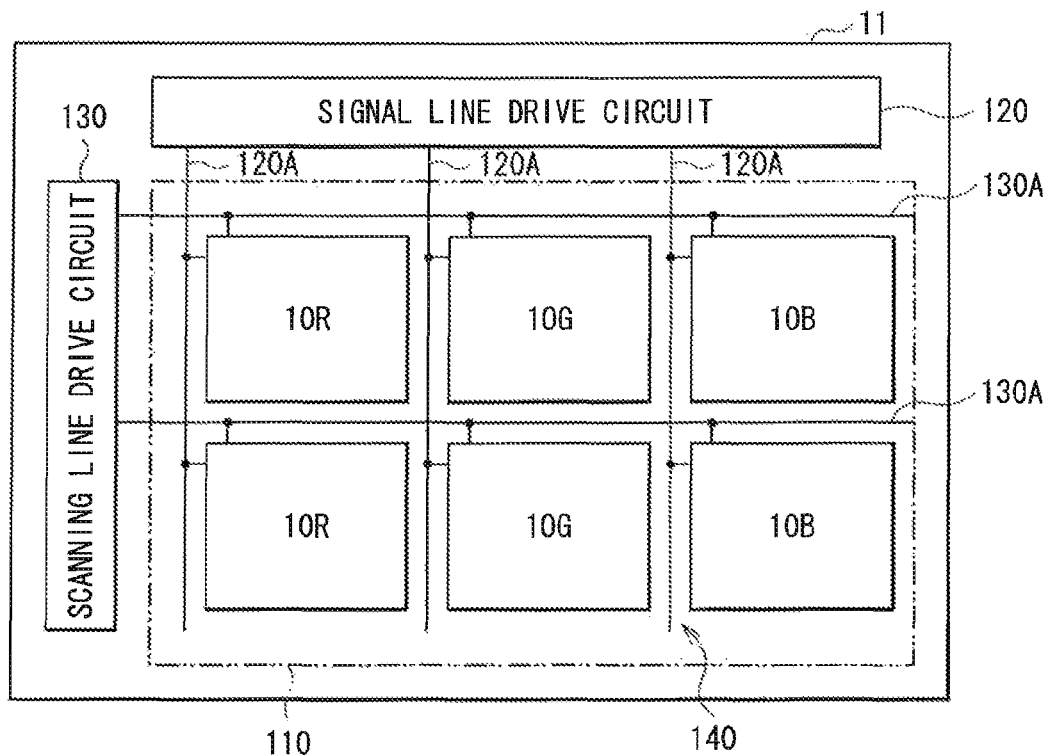
FIG. 13 is a diagram illustrating a structure of a display unit according to a second embodiment of the invention.

FIG. 13 illustrates a structure of a display unit according to a second embodiment of the invention. The display unit is used as an organic EL television unit or the like. In the display unit, for example, as a display region 110, a plurality of organic light emitting devices 10R, 10G, 10B are arranged in a matrix state over a substrate 11. A signal line drive circuit 120 and a scanning line drive circuit 130 that are drivers for displaying a video are formed on the periphery of the display region 110.

Figure 14:
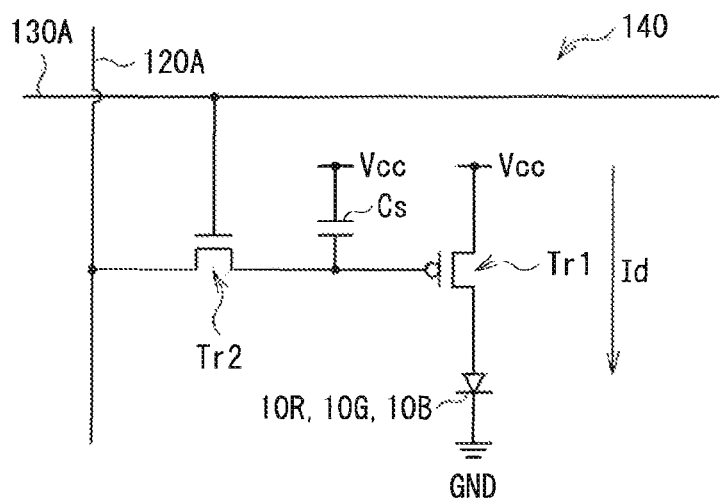
FIG. 14 is a diagram illustrating an example of the pixel drive circuit illustrated in FIG. 13.
Figure 15:
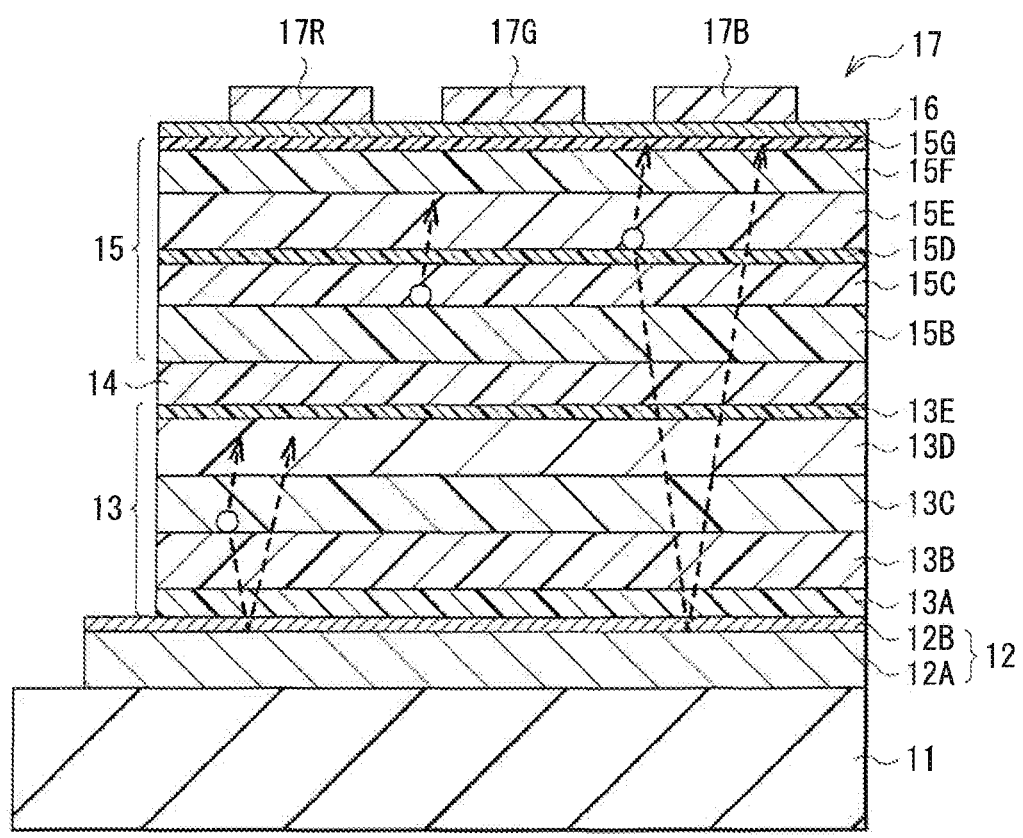
FIG. 15 is a cross sectional view illustrating a structure of the organic light emitting device illustrated in FIG. 13.
Figure 16:
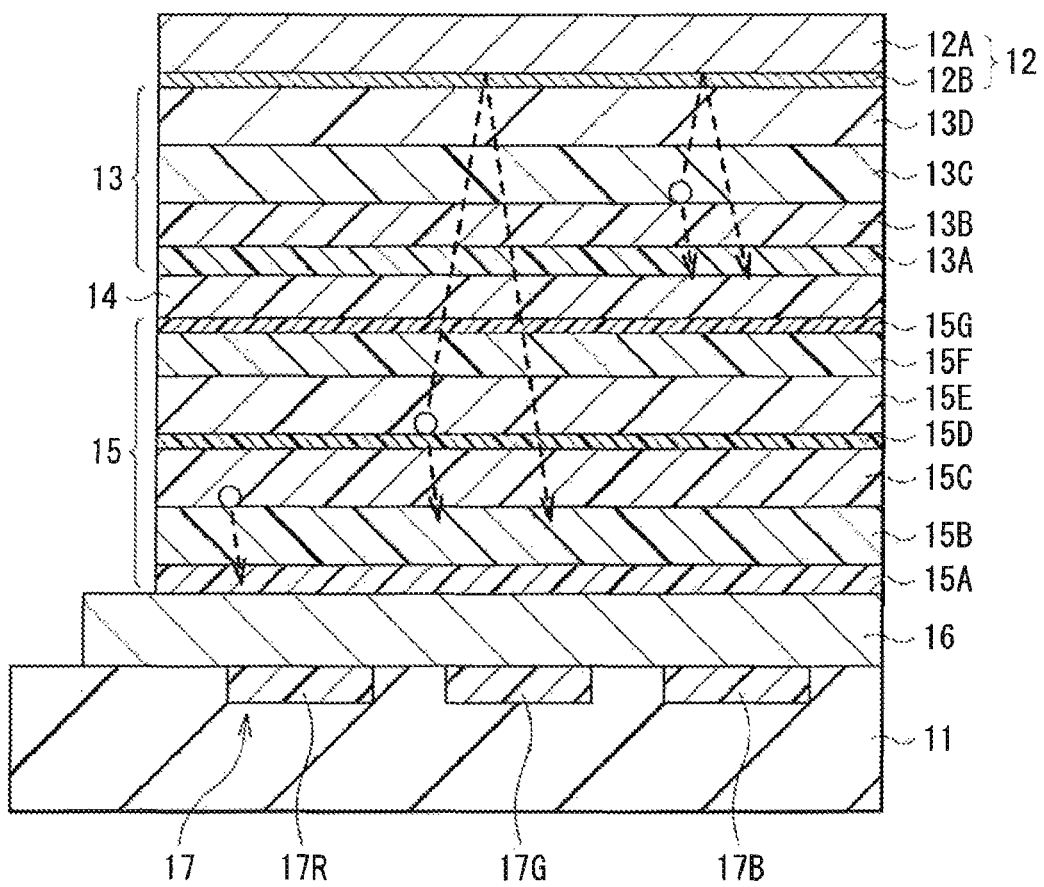
FIG. 16 is a cross sectional view illustrating another structure of the organic light emitting device illustrated in FIG. 13.

In the display region 110, a pixel drive circuit 140 is provided. FIG. 14 illustrates an example of the pixel drive circuit 140. The pixel drive circuit 140 is an active drive circuit that is formed in a layer located lower than the first electrode 12 or the second electrode 16. That is, the pixel drive circuit 140 has a drive transistor Tr1, a writing transistor Tr2, a capacitor (retentive capacity) Cs between the drive transistor Tr1 and the writing transistor Tr2, and the organic EL device 10R (or 10G, 10B) serially connected to the drive transistor Tr1 between a first power line (Vcc) and a second power line (GND). The drive transistor Tr1 and the writing transistor Tr2 are composed of a general thin film transistor (TFT (Thin Film Transistor)). The structure thereof is not particularly limited, and may be, for example, inversely staggered structure (so-called bottom gate type) or staggered structure (top gate type).

In the pixel drive circuit 140, a plurality of signal lines 120A are arranged in the column direction, and a plurality of scanning lines 130A are arranged in the row direction. Each cross section between each signal line 120A and each scanning line 130A corresponds to one of the organic light emitting devices 10R, 10G, and 10B (sub pixel). Each signal line 120A is connected to the signal line drive circuit 120. An image signal is supplied to a source electrode of the writing transistor Tr2 from the signal line drive circuit 120 through the signal line 120A. Each scanning line 130A is connected to the scanning line drive circuit 130. A scanning signal is sequentially supplied to a gate electrode of the writing transistor Tr2 from the scanning line drive circuit 130 through the scanning line 130A.

Figure 17:
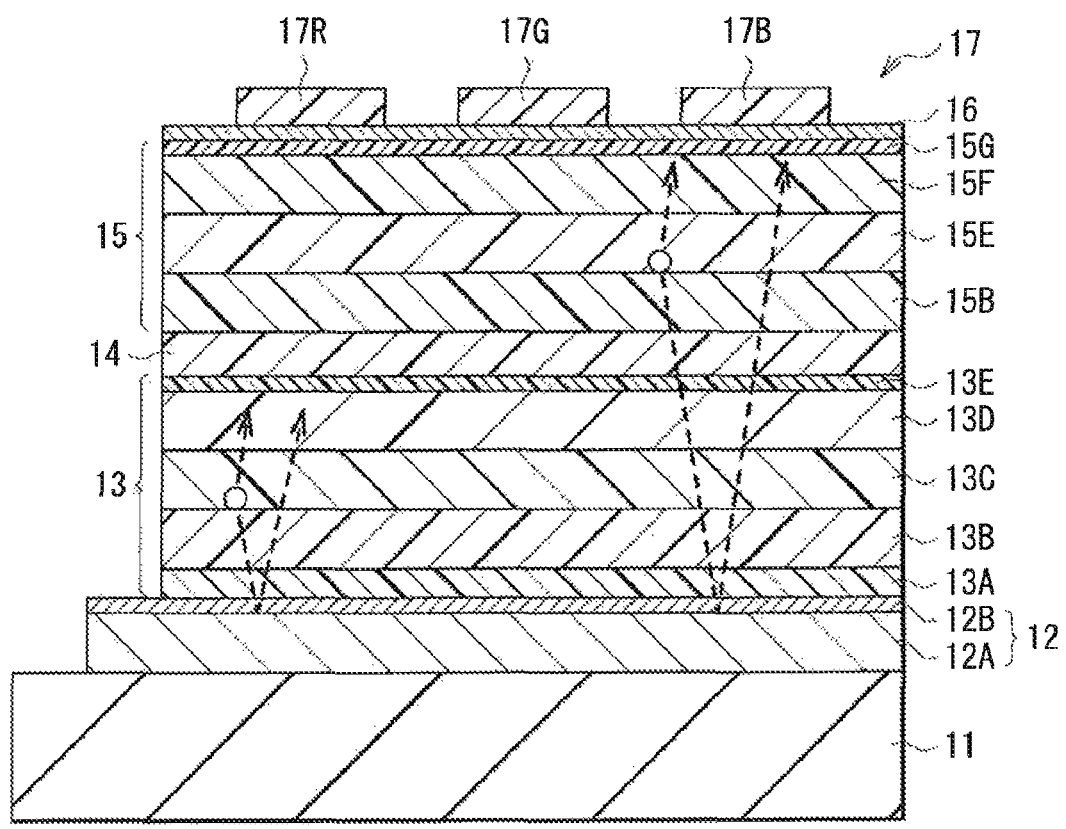
FIG. 17 is a cross sectional view illustrating still another structure of the organic light emitting device illustrated in FIG. 13.
Figure 18:
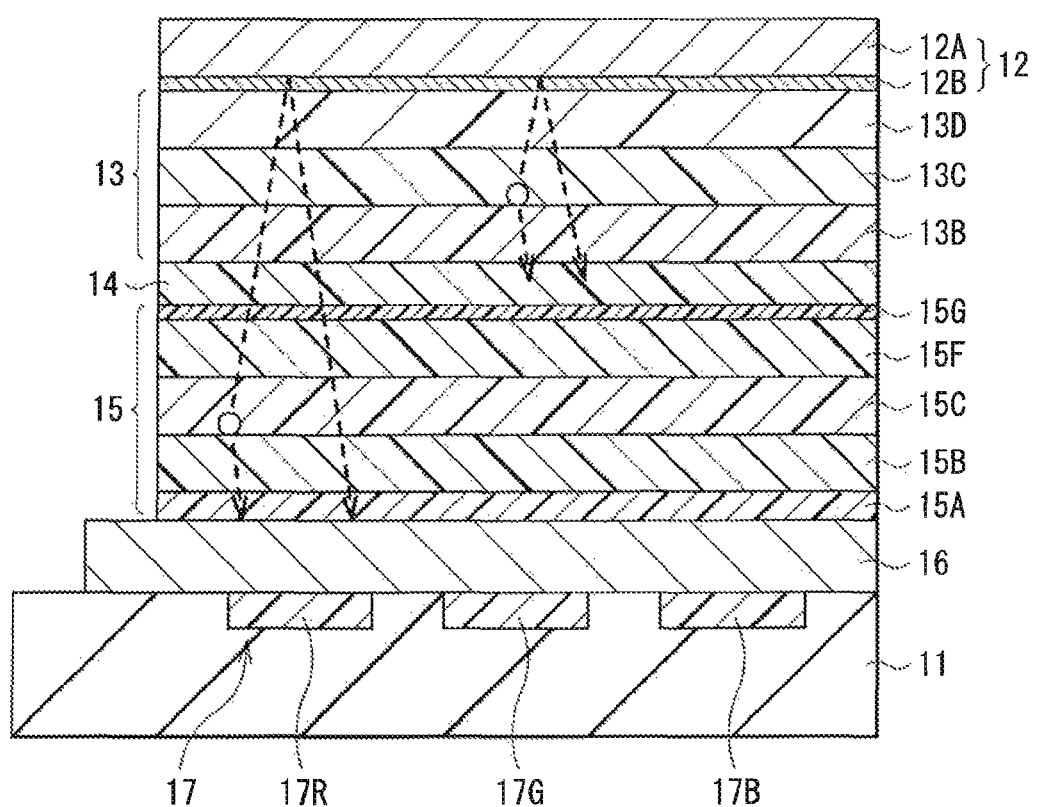
FIG. 18 is a cross sectional view illustrating still another structure of the organic light emitting device illustrated in FIG. 13.

FIG. 15 to FIG. 18 illustrate a cross sectional structure of the organic light emitting devices 10R, 10G, and 10B illustrated in FIG. 13. The organic light emitting devices 10R, 10G, and 10B illustrated in FIG. 15 to FIG. 18 have a structure similar to that of the foregoing first embodiment or the foregoing modified examples 1 to 3, except that the organic light emitting devices 10R, 10G, and 10B have a color filter 17 composed of a red filter 17R, a green filter 17G, and a blue filter 17B, and action and effect thereof are similar to those of the foregoing first embodiment or the foregoing modified examples 1 to 3. In FIG. 17 and FIG. 18, white light emission is obtained by color mixture of light from the blue light emitting layer 15C and the yellow light emitting layer 15E (or 15C).

The color filter 17 is intended to separate and extract the white light generated in the organic light emitting devices 10R, 10G, and 10B into red, green, and blue, and to absorb outside light reflected by the organic light emitting devices 10R, 10G, and 10B and the wiring in between to improve contrast. The red filter 17R, the green filter 17G, and the blue filter 17B are sequentially arranged correspondingly to the organic light emitting devices 10R, 10G, and 10B. The red filter 17R, the green filter 17G, and the blue filter 17B are respectively made of a resin mixed with a pigment. Adjustment is made by selecting a pigment so that light transmittance in the intended red, green, or blue wavelength region is high, and light transmittance in the other wavelength regions is low.

Further, the wavelength range with high transmittance in the red filter 17R, the green filter 17G, and the blue filter 17B corresponds with peak wavelengths $\lambda 1$ and $\lambda n$ of spectrum of light intensified by interference. Thereby, out of outside light entering from the second electrode 16 side, only light having a wavelength equal to the peak wavelengths $\lambda 1$ and $\lambda n$ of spectrum of light that is desirably extracted passes through the color filter 17, and outside light with other wavelengths is prevented from intruding into the organic light emitting devices 10R, 10G, and 10B.

In the display unit, the scanning signal is supplied from the scanning line drive circuit 130 to each pixel through the gate electrode of the writing transistor Tr2, and the image signal from the signal line drive circuit 120 is retained in the retentive capacity Cs through the writing transistor Tr2. That is, the drive transistor Tr1 is on-off controlled according to the signal retained in the retentive capacity Cs, and thereby a drive current Id is injected into the respective organic light emitting devices 10R, 10G, and 10B. In result, electron-hole recombination is generated to initiate light emission. The light is reflected by the first electrode 12 and interference is generated. After that, the light passes through the second electrode 16, is provided with color separation in the color filter 17, and is extracted.

Module and Application Examples

A description will be given of application examples of the display unit described in the foregoing embodiments. The display unit of the foregoing embodiments is able to be applied to a display unit of an electronic device in any field for displaying a video signal inputted from outside or a video signal generated inside as an image or a video, such as a television device, a digital camera, a notebook personal computer, a portable terminal device such as a mobile phone, and a video camera.

Module

Figure 19:
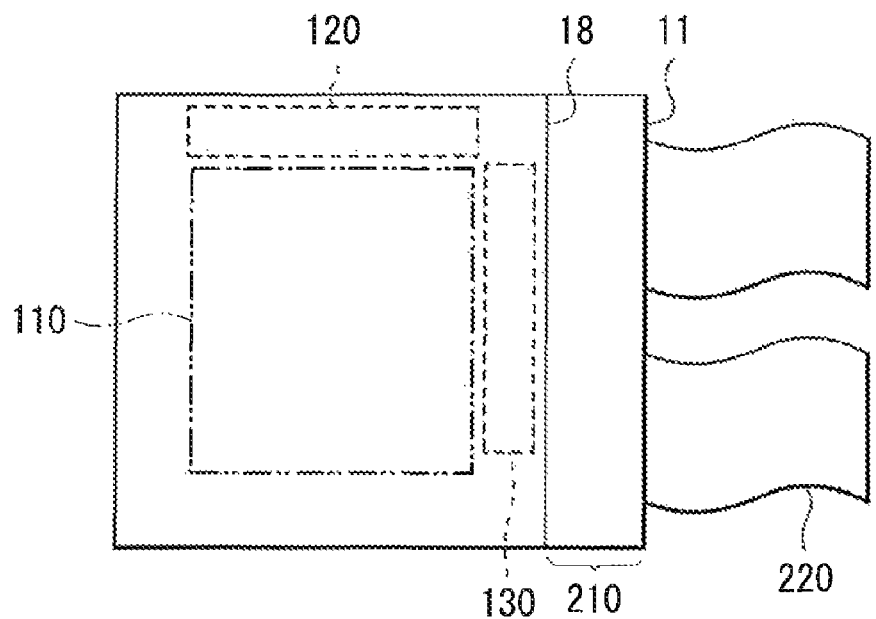
FIG. 19 is a plan view illustrating a schematic structure of a module including the display unit of the foregoing embodiments.

The display unit of the foregoing embodiment is incorporated in various electronic devices such as after-mentioned first to fifth application examples as a module as illustrated in FIG. 19, for example. In the module, for example, a region 210 exposed from a protective layer 18 is provided on a side of the substrate 11, and an external connection terminal (not illustrated) is formed in the exposed region 210 by extending the wirings of the signal line drive circuit 120 and the scanning line drive circuit 130. The external connection terminal may be provided with a Flexible Printed Circuit (FPC) 220 for inputting and outputting a signal.

First Application Example

Figure 20:
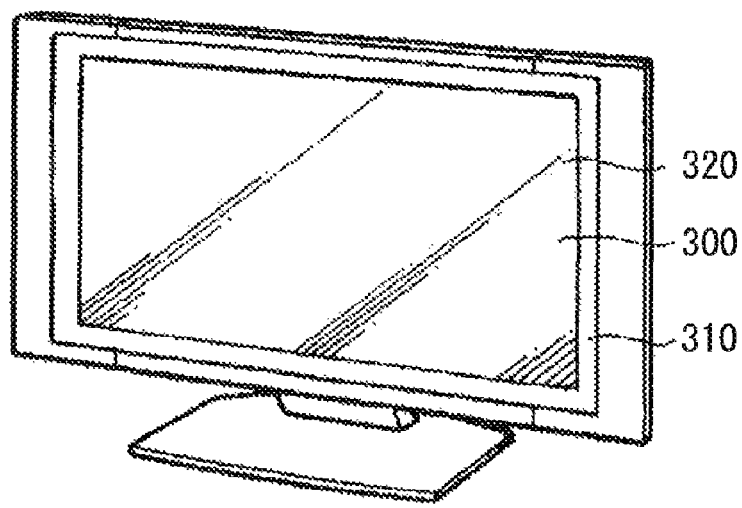
FIG. 20 is a perspective view illustrating an appearance of a first application example of the display unit of the foregoing embodiments.

FIG. 20 is an appearance of a television device to which the display unit of the foregoing embodiments is applied. The television device has, for example, a video display screen section 300 including a front panel 310 and a filter glass 320. The video display screen section 300 is composed of the display unit according to the foregoing embodiments.

Second Application Example

Figure 21A:
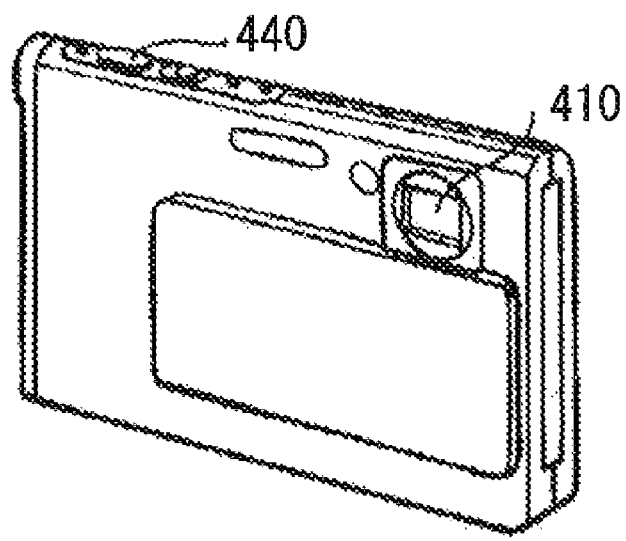
FIG. 21A is a perspective view illustrating an appearance viewed from the front side of a second application example.
Figure 21B:
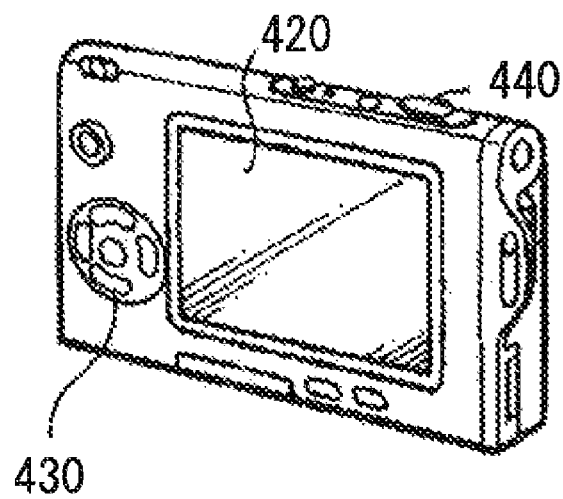
FIG. 21B is a perspective view illustrating an appearance viewed from the rear side of the second application example.

FIGS. 21A and 21B are an appearance of a digital camera to which the display unit of the foregoing embodiments is applied. The digital camera has, for example, a light emitting section for a flash 410, a display section 420, a menu switch 430, and a shutter button 440. The display section 420 is composed of the display unit according to the foregoing embodiments.

Third Application Example

Figure 22:
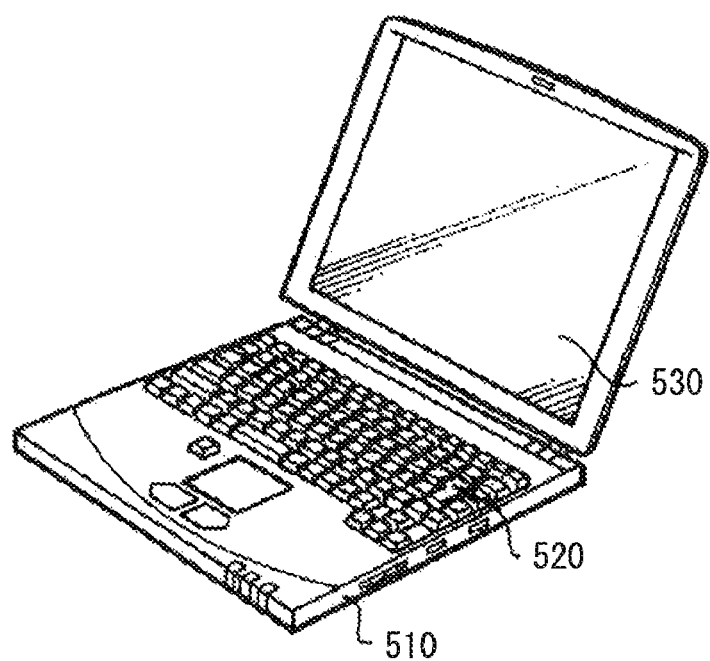
FIG. 22 is a perspective view illustrating an appearance of a third application example.

FIG. 22 is an appearance of a notebook personal computer to which the display unit of the foregoing embodiments is applied. The notebook personal computer has, for example, a main body 510, a keyboard 520 for operation of inputting characters and the like, and a display section 530 for displaying an image. The display section 530 is composed of the display unit according to the foregoing embodiments.

Fourth Application Example

Figure 23:
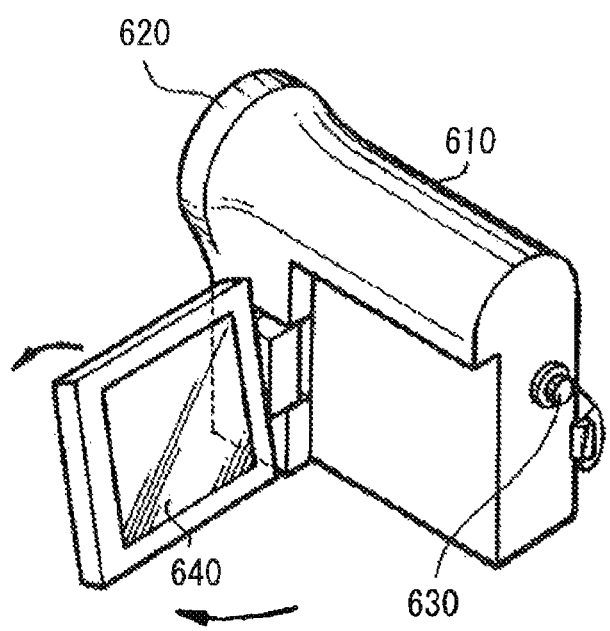
FIG. 23 is a perspective view illustrating an appearance of a fourth application example.
Figure 24:
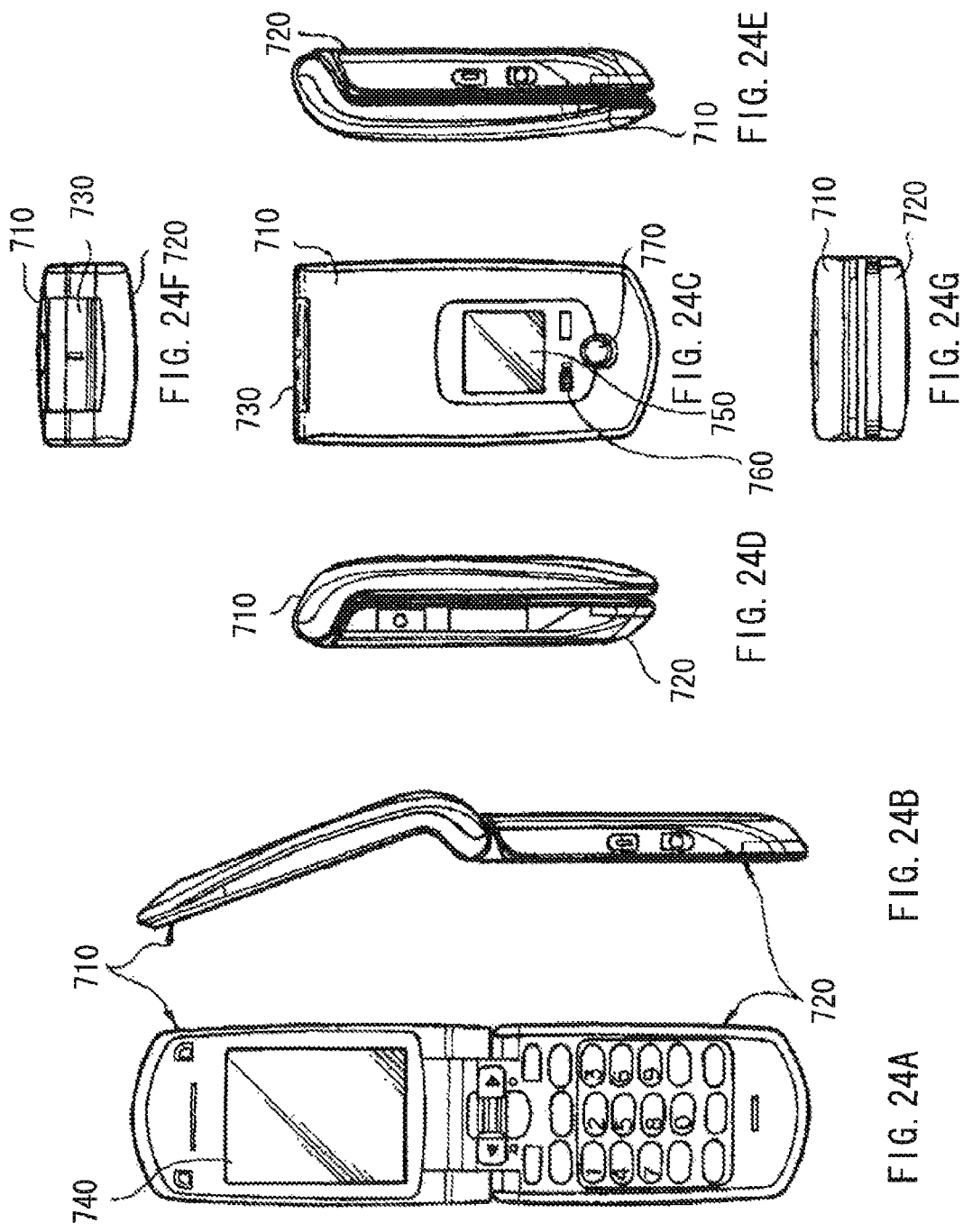
FIG. 24A is an elevation view of a fifth application example unclosed.
FIG. 24B is a side view thereof.
FIG. 24C is an elevation view of the fifth application example closed.
FIG. 24D is a left side view thereof.
FIG. 24E is a right side view thereof.
FIG. 24F is a top view thereof.
FIG. 24G is a bottom view thereof.

FIG. 23 is an appearance of a video camera to which the display unit of the foregoing embodiments is applied. The video camera has, for example, a main body 610, a lens for shooting an object 620 provided on the front side face of the main body 610, a start/stop switch in shooting 630, and a display section 640. The display section 640 is composed of the display unit according to the foregoing embodiments.

Fifth Application Example

FIGS. 24A to 24G are an appearance of a mobile phone to which the display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing embodiments.

EXAMPLES

A description will be given of specific examples of the invention.

Example 1

The two stage, three color, and bottom emission type organic light emitting device illustrated in FIG. 5 was fabricated in the same manner as that of the foregoing first modified example. At this time, a glass plate sized 30 mm*30 mm was used as the substrate 11.

The blue light emitting layer 13C was arranged to include the most proximal interference position IB0 (in the case where the order m1 in Mathematical formula 1 is 0: zero order interference position) that was closest to the first electrode 12 out of the blue interference positions IB0, IB1, IB2 and the like. The green light emitting layer 15E was arranged to include the position IB1 (in the case where the order mn in Mathematical formula 2 is 1: first order interference position) that was secondly closest to the first electrode 12 after the most proximal interference position IB0 out of the blue interference positions IB0, IB1 and the like.

For the obtained organic light emitting device, a voltage in 10 mA/cm$^2$ was examined The resultant value was 11 V, and the current efficiency was 13.5 cd/A. For the chromaticity point, white (0.29, 0.35) was observed.

Comparative Example 1

An organic light emitting device was fabricated in the same manner as that of the foregoing Example 1, except that the first electrode was a light transmissive electrode having a laminated structure composed of an LiF film having a thickness of 0.3 nm and an ITO film having a thickness of 20 nm to prevent interference. The ITO film was formed by sputtering method.

For the obtained organic light emitting devices of Example 1 and Comparative example 1, each light emitting spectrum was examined. The result obtained by standardizing the obtained spectrum at the blue light emitting peak position is illustrated in FIG. 25.

Figure 25:
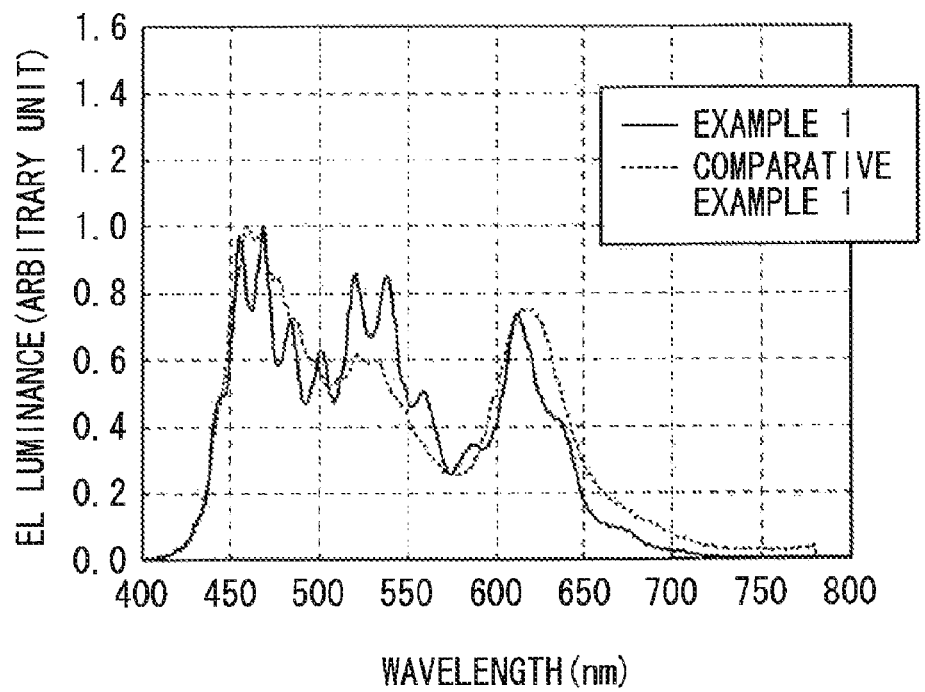
FIG. 25 is a diagram illustrating a result of an example.

As evidenced by FIG. 25, in Example 1 in which interference was generated by the light reflective first electrode 12, the green light emitting peak intensity was increased about 1.3 times that of Comparative example 1 in which interference was not generated. That is, it was found that in the case where the green light emitting layer 15E was arranged to include the position IB1 (in the case where the order mn in Mathematical formula 2 is 1: first order interference position)

that was secondly closest to the first electrode 12 after the most proximal interference position IB0 out of the blue interference positions IB0, IB1 and the like, green light emitting extraction efficiency was improved, and in result, favorable white spectrum was obtained.

Example 2

The two stage, three color, and top emission type organic light emitting device illustrated in FIG. 1 was fabricated in the same manner as that of the foregoing first embodiment.

The blue light emitting layer 13C was arranged to include the most proximal interference position IB0 (in the case where the order m1 in Mathematical formula 1 is 0: zero order interference position) that was closest to the first electrode 12 out of the blue interference positions IB0, IB1, IB2 and the like. The green light emitting layer 15E was arranged to include the position IB1 (in the case where the order mn in Mathematical formula 2 is 1: first order interference position) that was secondly closest to the first electrode 12 after the most proximal interference position IB0 out of the blue interference positions IB0, IB1 and the like.

When the obtained organic light emitting device was turned on, blue light derived from the first light emitting unit 13 and red and green light derived from the second light emitting unit 15 were mixed and white color light emission was observed. Further, a voltage in 10 mA/cm$^2$ was 11.2 V, and the current efficiency was 16.5 cd/A. For the chromaticity point, white (0.32, 0.28) was observed. That is, it was found that in the case where green light emitting layer 15E was arranged to include the position IB1 (in the case where the order mn in Mathematical formula 2 is 1: first order interference position) that was secondly closest to the first electrode 12 after the most proximal interference position IB0 out of the blue interference positions IB0, IB1 and the like, green light emitting extraction efficiency was improved, and in result, favorable white spectrum was obtained.

Example 3

The two stage, two color, and bottom emission type organic light emitting device illustrated in FIG. 8 was fabricated in the same manner as that of the foregoing third modified example.

The blue light emitting layer 13C was arranged to include the most proximal interference position IB0 (in the case where the order m1 in Mathematical formula 1 is 0: zero order interference position) that was closest to the first electrode 12 out of the blue interference positions IB0, IB1 IB2 and the like. The red light emitting layer 15C was arranged to include the position IB1 (in the case where the order mn in Mathematical formula 2 is 1: first order interference position) that was secondly closest to the first electrode 12 after the most proximal interference position IB0 out of the blue interference positions IB0, IB1 and the like.

For the obtained organic light emitting device, a voltage in 10 mA/cm$^2$ was examined. The resultant value was 11 V, and the current efficiency was 13.5 cd/A. For the chromaticity point, magenta (0.31, 0.23) was observed.

Comparative Example 3

An organic light emitting device was prepared in the same manner as that of the foregoing Example 3, except that the first electrode was a light transmissive electrode having a laminated structure composed of an LiF film having a thickness of 0.3 nm and an ITO film having a thickness of 20 nm to prevent interference. The ITO film was formed by sputtering method.

For the obtained organic light emitting devices of Example 3 and Comparative example 3, each light emitting spectrum was examined. The result obtained by standardizing the obtained spectrum at the blue light emitting peak position is illustrated in FIG. 26.

Figure 26:
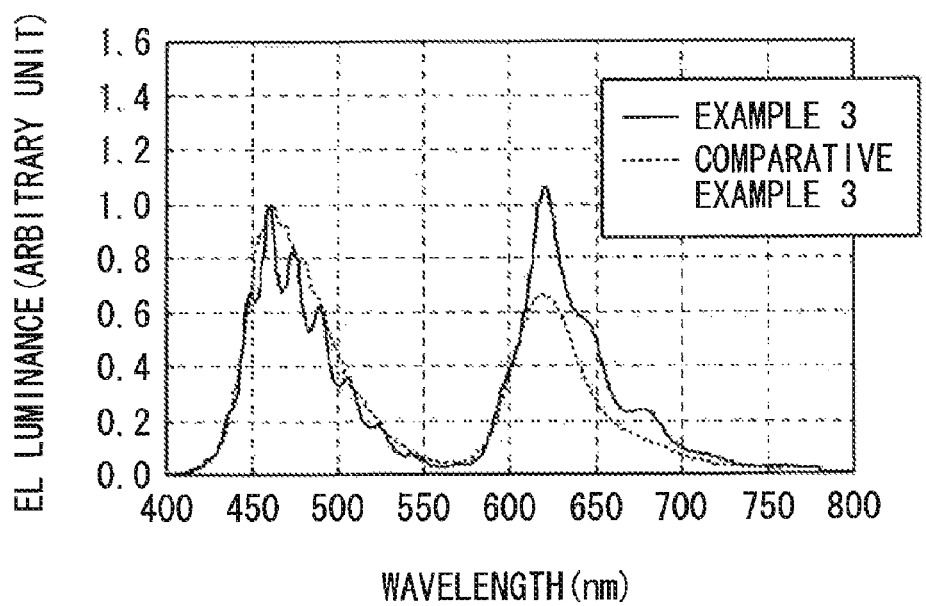
FIG. 26 is a diagram illustrating a result of an example.

As evidenced by FIG. 26, in Example 3 in which interference was generated by the light reflective first electrode 12, the red light emitting peak intensity was increased about 1.4 times that of Comparative example 3 in which interference was not generated. That is, it was found that in the case where the red light emitting layer was arranged to include the blue interference position, red light emitting extraction efficiency was improved, and luminance was able to be improved.

While the invention has been described with reference to the embodiments and the examples, the invention is not limited to the foregoing embodiments and the foregoing examples, and various modifications may be made. For example, two or more light emitting layers may be provided in the first light emitting unit 13.

Further, for example, the material, the thickness, the film-forming method, the film-forming conditions and the like of each layer are not limited to those described in the foregoing embodiments and the examples, but other material, other thickness, other film-forming method, and other film-forming conditions may be adopted.

Further, in the foregoing embodiments and the examples, the description has been specifically given of the structure of the organic light emitting devices 10R, 10G, and 10B. However, it is not always necessary to provide all layers, and other layer may be further provided.

In addition, in the foregoing second embodiment, the description has been given of the active matrix display unit. However, the invention is able to be also applied to a passive matrix display unit. Furthermore, the structure of the pixel drive circuit for driving the active matrix is not limited to the structure described in the foregoing second embodiment. If necessary, a capacity device or a transistor may be added. In this case, according to the change of the pixel drive circuit, a necessary drive circuit may be added in addition to the foregoing signal line drive circuit 120 and the scanning line drive circuit 130.

It should be understood by those skilled in the art that various modifications, combinations, sub combinations and alternations may occur depending on design requirements and other factors insofar as they are within the scope of the appended claims or the equivalents thereof.

What is claimed is:
1. An organic light emitting device, comprising:
a first electrode on a substrate;
a second electrode on the substrate; and
a plurality of light emitting units between the first electrode and the second electrode, the plurality of light emitting units including a first light emitting unit that includes a first light emitting layer, and a second light emitting unit that includes a second light emitting layer,
wherein,
the first electrode reflects light from at least one of the plurality of light emitting units to generate an interference pattern with light emitted from the first light emitting layer,
the interference pattern includes a plurality of interference positions, the plurality of interference positions being located at peak positions of the resulting inter- ference between the reflected light and the light emitted from the first light emitting layer, and the plurality of light emitting units are positioned such that a first interference position is located within the first light emitting layer, and a second interference position is located within the second light emitting layer.

2. The device of claim 1, wherein the first interference position is located closer to the first electrode than the second interference position.

3. The device of claim 1, wherein the first light emitting unit is positioned closer to the first electrode than the second light emitting unit.

4. The device of claim 1, wherein,
the first light emitting layer is a blue light emitting layer, and
the second light emitting layer is a different color from the first light emitting layer.

5. The device of claim 4, wherein,
the second light emitting layer is selected from a group consisting of a red light emitting layer and a green light emitting layer.

6. The device of claim 1, wherein the second light emitting layer is a yellow light emitting layer such that white light is obtained by a color mixture of the light from the first light emitting layer and the yellow light emitting layer.

7. The device of claim 1, further comprising:
an electric charge layer positioned between the first light emitting unit and the second light emitting unit.

8. The device of claim 1, wherein,
the first light emitting unit further includes an electron transport layer,
the second light emitting unit further includes an electron hole transport layer, and
a thickness of the electron transport layer is larger than a thickness of the electron hole transport layer.

9. An organic light emitting device, comprising:
a stack that includes an anode, a first light emitting layer, a second light emitting layer, and a cathode, the stack being configured to emit white light and generate interference between light emitted from the first light emitting layer and light reflected from the anode,
wherein,
the resulting interference has an interference pattern that includes a first interference peak position and a second interference peak position,
the first interference peak position is located within the first light emitting layer, and
the second interference peak position is located within the second light emitting layer, the second light emitting layer being selected from a group consisting of a red light emitting layer, a green light emitting layer, and a yellow light emitting layer.

10. The device of claim 9, wherein the first light emitting layer is a blue light emitting layer.

11. The device of claim 9, wherein the anode is a laminated structure that includes a metal film and a transparent electrode film.

12. The device of claim 9, wherein color filters are provided on a side of the cathode that faces away from the anode.

13. The device of claim 9, wherein an optical distance between the first interference peak position and the anode is less than an optical distance between the second interference peak position and the anode.

14. The device of claim 9, wherein an optical distance ($L_1$) between the first interference position and the anode is set such that $L_1 = (m_1 - \Phi/2\pi) \cdot \lambda_1/2$,
wherein,
$m_1$ represents zero or an integer,
$\Phi$ represents a phase shift that is generated when light generated in the first light emitting layer is reflected by the first electrode, and
$\lambda_1$ represents a peak wavelength of spectrum when light generated in the first light emitting layer is irradiated from a side facing the cathode.

15. The device of claim 14, wherein an optical distance ($L_2$) between the second interference position and the anode is set such that $L_2 = (m_2 - \Phi/2\pi) \lambda_2/2$
wherein,
$m_2$ represents an integer such that $m_2 > m_1$,
$\Phi$ represents a phase shift that is generated when light generated in the first light emitting layer is reflected by the first electrode, and
$\lambda_2$ represents a peak wavelength of spectrum when light generated in the first light emitting layer is irradiated from a side facing the cathode.

16. The device of claim 9, further comprising:
an electric charge layer positioned in the stack, the electric charge layer being between the first light emitting layer and the second light emitting layer.

17. A method of fabricating an organic light emitting device that emits white light, comprising:
forming an anode of a laminate structure having a metal film and a transparent film;
forming a plurality of light emitting units on one side of the anode, the plurality of light emitting units including (a) a first light emitting unit having a first light emitting layer and (b) a second light emitting unit having a second light emitting layer, wherein the first light emitting unit and the second light emitting unit are separated by an intervening electric charge layer; and
forming a cathode such that the plurality of light emitting units are between the anode and the cathode in a stack structure;
wherein,
an interference pattern is generated between light emitted from the first light emitting layer and light reflected from the anode, the interference pattern includes a first interference peak position and a second interference peak position,
a distance between the anode and the first light emitting layer is formed such that a first interference peak position of the interference pattern is located within the first light emitting layer, and
a distance between the anode and the second light emitting layer is formed such that the second interference peak position of the interference pattern is located within the second light emitting layer.

18. The method of claim 17, wherein,
the first light emitting layer is a blue light emitting layer, and
the second light emitting layer emits a color of light that is different from the first light emitting layer.

19. A display unit, comprising
a display region, and
a plurality of organic light emitting devices within the display region,
wherein each organic light emitting device, comprises:
an anode;
a cathode; and
a plurality of light emitting units between the anode and the cathode, the plurality of light emitting units including a first light emitting unit that includes a first light emitting layer, and a second light emitting unit that includes a second light emitting layer, wherein, the anode reflects light from at least one of the plurality of light emitting units to generate an interference pattern with light emitted from the first light emitting layer, the interference pattern including a plurality of interference peaks, and the plurality of light emitting units being positioned such that the first light emitting layer intercepts a first interference peak, and the second light emitting layer intercepts a second interference peak.

20. An illuminating device, comprising
a lighting section, and
an organic light emitting device that is enabled to emit light from within the lighting section, the organic light emitting device comprises:

an anode;
a cathode; and
a plurality of light emitting units between the anode and the cathode, the plurality of light emitting units including a first light emitting unit that includes a first light emitting layer, and a second light emitting unit that includes a second light emitting layer, wherein, the anode reflects light from at least one of the plurality of light emitting units to generate an interference pattern with light emitted from the first light emitting layer, the interference pattern including a plurality of interference peaks, and the plurality of light emitting units being positioned such that the first light emitting layer intercepts a first interference peak, and the second light emitting layer intercepts a second interference peak.

* * * * *